United States Patent
Yoshimura

(10) Patent No.: US 7,622,887 B2
(45) Date of Patent: Nov. 24, 2009

(54) POWER ELECTRONICS EQUIPMENTS

(75) Inventor: Hiroyuki Yoshimura, Yokohama (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 301 days.

(21) Appl. No.: 11/702,558

(22) Filed: Feb. 6, 2007

(65) Prior Publication Data

US 2007/0218595 A1 Sep. 20, 2007

(30) Foreign Application Priority Data

Mar. 16, 2006 (JP) ............................. 2006-073164

(51) Int. Cl.
*H02P 23/00* (2006.01)
(52) U.S. Cl. .................. 318/810; 318/813; 318/815
(58) Field of Classification Search ................ 318/139, 318/254, 439, 500, 800, 810, 813, 815; 323/250; 363/21.02; 361/18; 330/10
See application file for complete search history.

(56) References Cited

U.S. PATENT DOCUMENTS

| | | | |
|---|---|---|---|
| 3,983,321 A * | 9/1976 | Vandling | 358/474 |
| 4,554,512 A * | 11/1985 | Aiello | 330/10 |
| 5,384,808 A | 1/1995 | Van Brunt et al. | |
| 5,449,991 A * | 9/1995 | Owen | 318/500 |
| 5,469,041 A * | 11/1995 | Bourgeois | 318/810 |
| 5,533,054 A | 7/1996 | DeAndrea et al. | |
| 5,596,466 A * | 1/1997 | Ochi | 361/18 |
| 5,701,037 A | 12/1997 | Weber et al. | |
| 6,320,765 B2 * | 11/2001 | Yasumura | 363/21.02 |
| 2002/0125244 A1 | 9/2002 | Yokozeki et al. | |
| 2006/0033552 A1* | 2/2006 | Ishikawa et al. | 327/432 |
| 2007/0216377 A1* | 9/2007 | Yoshimura | 323/250 |

FOREIGN PATENT DOCUMENTS

| | | |
|---|---|---|
| EP | 0 282 102 | 9/1988 |
| EP | 0 307 345 | 3/1989 |
| FR | 2 679 670 | 1/1993 |
| WO | WO 98/37672 | 8/1998 |
| WO | WO 99/21332 | 4/1999 |
| WO | WO 01/61951 | 8/2001 |
| WO | WO 2004/100473 | 11/2004 |

\* cited by examiner

*Primary Examiner*—Paul Ip
(74) *Attorney, Agent, or Firm*—Manabu Kanesaka

(57) ABSTRACT

Power electronics equipment includes air-cored insulating transformers inserted between a control circuit grounded to a vehicle body and an upper arm biased at a high voltage, and air-cored insulating transformers between the control circuit grounded to the vehicle body and the lower arm biased at a high voltage. Each of the air-cored insulating transformers includes a primary winding and a secondary facing to each other. The power electronics equipment facilitates improving resistance against hazardous environments, suppressing the deterioration by aging, reducing the adverse effects of noise caused by external magnetic flux, and transmitting and receiving signals while insulating the low and high voltage sides electrically from each other.

14 Claims, 16 Drawing Sheets

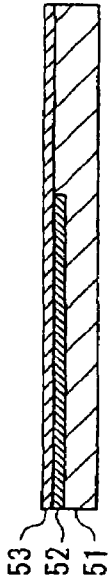
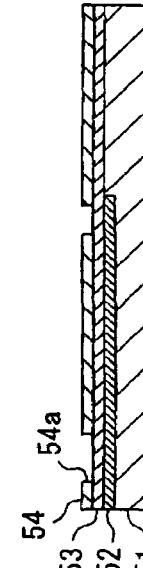
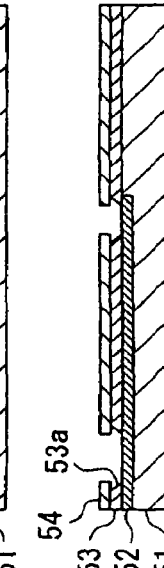
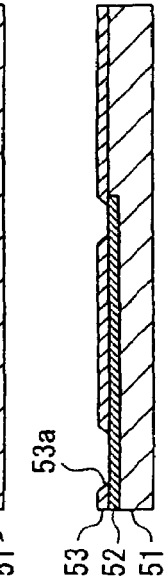
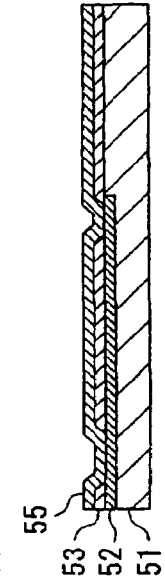
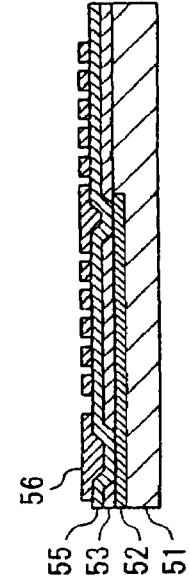
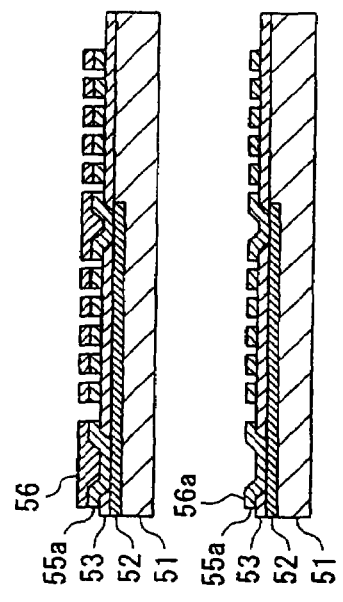
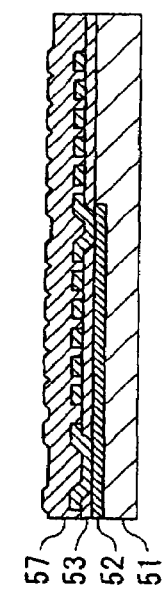
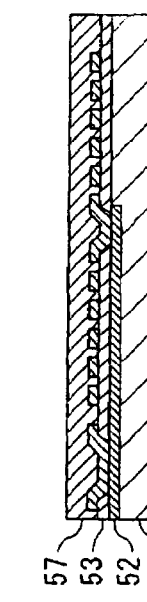
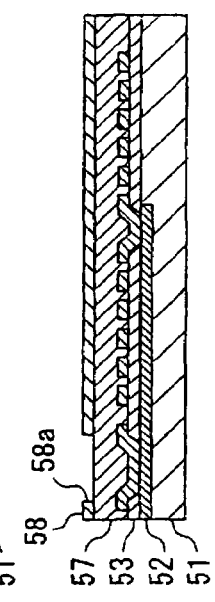

POWER ELECTRONICS EQUIPMENTS

BACKGROUND OF THE INVENTION AND RELATED ART STATEMENT

The present invention relates to power electronics equipment. Specifically, the present invention relates to power electronics equipment well suited for transmitting signals to switching devices via insulating transformers.

Vehicle equipment is mounted with a step-up and step-down converter and an inverter on the driving system of a motor that generates driving power for improving conversion efficiency and for reducing energy consumption.

FIG. 11 is a block diagram schematically showing a vehicle driving system that employs a conventional step-up and step-down converter.

Referring now to FIG. 11, the vehicle driving system includes a power supply 1101 that feeds electric power to a step-up and step-down converter 1102 that boosts and steps down a voltage, an inverter 1103 that converts the voltage outputted from step-up and step-down converter 1102 to the components of a three-phase voltage, and a motor 1104 that drives the vehicle. Power supply 1101 may be comprised of a voltage fed through overhead wires or batteries connected in series.

In driving the vehicle, step-up and step-down converter 1102 boosts the voltage of power supply 1101 (e.g. 280 V) to a voltage suited for driving motor 1104 (e.g. 750 V) and feeds the boosted voltage to inverter 1103. By controlling the ON and OFF state of the switching devices in inverter 1103, the voltage boosted by step-up and step-down converter 1102 is applied during each phase of motor 1104 and a phase shift and current flow is generated. By controlling the switching frequency of inverter 1103, the vehicle speed can be changed.

In braking the vehicle, inverter 1103 controls the ON and OFF state of the switching devices synchronizing with voltage components generated in the phases of motor 1104 to rectify and convert the three-phase voltage to a DC voltage that feeds step-up and step-down converter 1102. Step-up and step-down converter 1102 steps down the voltage generated in motor 1104 (e.g. 750 V) to the voltage of power supply 1101 (e.g. 280 V) to conduct regeneration operations.

FIG. 12 is a block circuit diagram of the step-up and step-down converter shown in FIG. 11.

Referring now to FIG. 12, step-up and step-down converter 1102 includes a reactor L for energy storage, capacitor C that accumulates electric charges, switching devices SW1 and SW2 that directs current flow into inverter 1103 and interrupt the current flowing into inverter 1103. Converter 1102 also includes and control circuits 1111 and 1112 that generate control signals directing the conduction and non-conduction of switching devices SW1 and SW2.

Switching devices SW1 and SW2 are connected in series. Power supply 1101 is connected to the connection point of switching devices SW1 and SW2 via reactor L. Switching device SW1 comprises an insulated gate bipolar transistor (hereinafter referred to as an "IGBT") 1105 that conducts switching operations in response to the control signal from control circuit 1111. A free-wheel diode D1 is connected in parallel to IGBT 1105 and makes a current flow in a direction opposite to the direction of the current flowing through IGBT 1105.

Switching device SW2 comprises an IGBT 1106 that conducts switching operations in response to the control signal from control circuit 1112. A free-wheel diode D2 is connected in parallel to IGBT 1106 and makes a current flow in a direction opposite to the flow direction of the current flowing through IGBT 1106. The collector of IGBT 1106 is connected to capacitor C and inverter 1103.

FIG. 13 is a wave chart illustrating the waveform of the current flowing through reactor L, shown in FIG. 12, in the boosting operation.

Referring now to FIG. 13, as IGBT 1105 in switching device SW1 becomes ON (conductive) in the boosting operation, a current I flows through reactor L via IGBT 1105, storing the energy of $LI^2/2$ in reactor L.

Then, as IGBT 1105 in switching device SW1 becomes OFF (nonconductive), a current flows through free-wheel diode D2 in switching device SW2, transferring the energy stored in reactor L to capacitor C.

In the stepping down operation, as IGBT 1106 in switching device SW2 becomes ON (conductive), a current I flows through reactor L via IGBT 1106, storing the energy of $LI^2/2$ in reactor L.

Then, as IGBT 1106 in switching device SW2 becomes OFF (nonconductive), a current flows through free-wheel diode D1 in switching device SW1, regenerating the energy stored in reactor L to power supply 1101.

By changing the ON-period (ON duty) of the switching devices, the boosted and stepped down voltages maybe adjusted. The approximate voltage value is obtained from the following formula.

$$V_L/V_H = \text{ON duty (\%)}$$

Here, $V_L$ is the power supply voltage, $V_H$ is the voltage after the boosting or the stepping down, and the ON duty is the ratio of the conduction period of switching device SW1 or SW2 to the switching period thereof.

In practice, there are variations in the load and the power supply voltage $V_L$. Therefore, the ON period (ON duty) of switching device SW1 or SW2 is controlled by means of monitoring the voltage $V_H$ after the boosting or the stepping down so that after the boosting or the stepping down, the voltage $V_H$ may be made equal to the reference value.

Since control circuits 1111 and 1112, grounded to the vehicle body, are on the low voltage side, the arms connected to switching devices SW1 and SW2 are on the high voltage side. So as not to expose any human body to danger, even if an accident, such as the breakdown of switching device SW1 or SW2 is caused, signal transmission and reception are conducted between the arms and control circuits 1111, 1112, while the arms and control circuits 1111, 1112 are electrically insulated from each other by photocouplers.

FIG. 14 is a block diagram schematically showing an intelligent power module for the conventional step-up and step-down converter.

Referring now to FIG. 14, the intelligent power module for the step-up and step-down converter includes switching devices SWU and SWD that direct current flow to the load and interrupt the current flowing to the load. The intelligent power module also includes a control circuit 1 that generates control signals directing the conduction and non-conduction of switching devices SWU and SWD. Control circuit 1 may be comprised of a CPU 4 or a logic IC, or a system LSI that mounts a logic IC and a CPU thereon.

Switching devices SWU and SWD are connected in series so that SWU and SWD may work for an upper arm 2 and for a lower arm 3, respectively. The SWU includes an IGBT 6 that conducts switching operations in response to a gate signal SU4. A free-wheel diode DU1 that makes a current flow in a direction opposite to the flow of current through IGBT 6 is connected in parallel to IGBT 6. The chip on which IGBT 6 is formed includes a temperature sensor that uses the VF (Forward Voltage) change of a diode DU2, caused by the chip temperature change, to measure temperature. In addition, a current sensor, which detects the main circuit current by dividing the emitter current of IGBT 6 with resistors RU1 and RU2, is included in the chip.

An IGBT 5 that conducts switching operations in response to a gate signal SD4 is disposed in switching device SWD. A free-wheel diode DD1 that makes a current flow in a direction opposite to the current flowing through IGBT 5 is connected in parallel to IGBT 5. On the chip, in which IGBT 5 is formed, a temperature sensor, which employs the VF change of a diode DD2 caused by the chip temperature change for the measurement principle thereof, and a current sensor, which detects the main circuit current by dividing the emitter current of IGBT 5 with resistors RD1 and RD2, are disposed.

On the side of upper arm 2, a gate driver IC 8 provides protection functions that monitors an overheat detection signal SU6 from the temperature sensor and an overcurrent detection signal SU5 from the current sensor and further generates a gate signal SU4 for driving the control terminal of IGBT 6. An analog-PWM converter CU that generates a PWM signal indicating the temperature of IGBT 6 is also disposed on the side of upper arm 2.

On the side of lower arm 3, a gate driver IC 7 provides protection functions that monitors an overheat detection signal SD6 from the temperature sensor and an overcurrent detection signal SD5 from the current sensor and generates a gate signal SD4 for driving the control terminal of IGBT 5. Also disposed on the side of lower arm 3 is an analog-PWM converter CD that generates a PWM signal corresponding to the temperature of IGBT 5.

Photocouplers FU1 through FU3 are inserted between control circuit 1, grounded to the vehicle body and upper arm 2, biased at a high voltage. Photocouplers FD1 through FD3 are inserted between control circuit 1, grounded to the vehicle body, and lower arm 3, biased at a high voltage. Control circuit 1 transmits signals to upper arm 2 and receives signals from upper arm 2 via photocouplers FU1 through FU3, while control circuit 1 is insulated electrically from upper arm 2 by photocouplers FU1 through FU3. Control circuit 1 transmits signals to lower arm 3 and receives signals from lower arm 3 via photocouplers FD1 through FD3, while control circuit 1 is insulated electrically from lower arm 3 by photocouplers FD1 through FD3.

In detail, a PWM (Pulse Width Modulation) gate driving signal SU1 is output from CPU 4 and is inputted to gate driver IC 8, which provides protection functions, in upper arm 2 via photocoupler FU1. An alarm signal SU2 outputted from gate driver IC 8 which provides protection functions, is inputted to CPU 4 via photocoupler FU2. A PWM signal SU3 indicating the IGBT chip temperature and outputted from analog-PWM converter CU is inputted to CPU 4 via photocoupler FU3.

A PWM gate driving signal SD1 is outputted from CPU 4 and is inputted to gate driver IC 7, which provides protection functions, in the lower arm 3 via photocoupler FD1. An alarm signal SD2 outputted from gate driver IC 7, which provides protection functions, is inputted to CPU 4 via photocoupler FD2. A PWM signal SD3 indicating the IGBT chip temperature and outputted from analog-PWM converter CD is inputted to CPU 4 via photocoupler FD3.

FIG. 15 is a block diagram schematically showing the peripheral circuit of a photocoupler.

Referring now to FIG. 15, photocoupler 2008 includes: an infrared light emitting diode 2003 that emits an infrared ray based on a forward current If, a light receiving diode 2004 that receives the emitted infrared ray, and a bipolar transistor 2005 that conducts current amplifying operations employing the photocurrent generated in light receiving diode 2004 for the base current thereof. The cathode of infrared light emitting diode 2003 is connected to a field effect transistor 2001 via a resistor 2002. The collector of bipolar transistor 2005 is connected to a power supply voltage Vcc2 via a resistor 2006. An output signal Vout, outputted via the collector of bipolar transistor 2005, is inputted to an IGBT driver IC 2007.

As a signal SP is inputted to the gate of field effect transistor 2001, forward current If flows through infrared light emitting diode 2003, emitting an infrared ray. The infrared ray emitted from infrared light emitting diode 2003 is received by light receiving diode 2004 and a photocurrent corresponding to the received infrared ray flows to the base of bipolar transistor 2005. As the photocurrent flows to the base of bipolar transistor 2005, a collector current $I_C$ flows to bipolar transistor 2005. By making collector current $I_C$ flow through resistor 2006, the first end of which is connected to the power supply voltage Vcc2, the voltage change at the second end of resistor 2006 is inputted to IGBT driver IC 2007 as output signal Vout.

The input and output characteristics of photocoupler 2008 are defined by the current transfer ratio (hereinafter referred to as the "CTR"), that is, $I_C/If$. In designing a circuit using photocoupler 2008, it is necessary to consider (1) the temperature characteristics of the current amplification factor hfe of bipolar transistor 2005, (2) the deterioration by aging of the light emission efficiency of infrared light emitting diode 2003, (3) the variations of the CTR, and such factors.

FIG. 16 is a curve describing the temperature dependence of the current transfer ratio of the photocoupler.

Referring now to FIG. 16, the current transfer ratio of photocoupler 2008 is lower, as the temperature is lower due to the temperature dependence of the current amplification factor hfe of bipolar transistor 2005.

FIG. 17 is a curve depicting the deterioration by aging of the current transfer ratio of the photocoupler, and illustrates whereby the CTR of photocoupler 2008 decreases depending on the forward current, environmental temperature and accumulated operating time of light emitting diode 2003. Especially when photocoupler 2008 is used continuously for more than 1000 hr, remarkable CTR lowering is caused.

Alternatively to the photocoupler, an insulating transformer is used for a means for insulating the transmitted signal.

FIG. 18 is a top plan view schematically showing a conventional insulating transformer for signal transmission.

Referring now to FIG. 18, the insulating transformer includes a magnetic core MC. A primary winding M1 and a secondary winding M2 are wound around magnetic core MC. Magnetic core MC may be made of ferrite, permalloy and other such ferromagnetic material. The magnetic flux φ generated by the current fed to primary winding M1 is localized into magnetic core MC and is made to pass through magnetic core MC. Magnetic flux φ intersects secondary winding M2, generating a voltage dφ/dT across secondary winding M2. Since a closed magnetic path is formed by using magnetic core MC, the adverse effects of the external magnetic field are reduced and the coupling coefficient of primary winding M1 and secondary winding M2 is increased.

FIG. 19 is a block diagram of a signal transmission circuit using a conventional insulating transformer for signal transmission.

Referring now to FIG. 19, a first end of the primary winding in an insulating transformer T is connected to the drain of a field effect transistor M1 via a resistor R1, and a first end of the secondary winding in insulating transformer T is connected to a demodulator circuit 1203. A local oscillation signal generated in a local oscillator circuit 1201 is inputted to a modulator circuit 1202. As a PWM signal SP is inputted to modulator circuit 1202, the local oscillation signal is modulated by PWM signal SP and the modulated local oscillation signal is inputted to the gate of field effect transistor M1 for the control signal thereof. As the control signal is inputted to the gate of field effect transistor M1, a modulated signal modulated at a high frequency is inputted to demodulator circuit 1203 via insulating transformer T, and PWM signal SP is demodulated in demodulator circuit 1203.

The following Patent Document 1 discloses an induction heating apparatus including a heating roller, which includes a hollow roller base body and a plurality of secondary coils formed over the roller base body, and a primary coil disposed in the heating roller, wherein the primary and secondary coils are coupled with each other in an induction transformer coupling relationship to improve the electric power transfer efficiency thereof.

The following Patent Document 2 discloses the connection of a driver formed on a first substrate and a receiver formed on a second substrate by the magnetic coupling using coils.

The following Patent Document 3 discloses the use of a link coupling transformer as a logic separation circuit for isolating an input circuit and an output circuit from each other.

[Patent Document 1] Japanese Patent Application Publication No. 2002-222688 (Counterpart U.S. Pat. No. 6,847,019)

[Patent Document 2] Published Japanese Translation of PCT International Publication for Patent Application 2001-521160 (Counterpart U.S. Pat. No. 6,054,780)

[Patent Document 3] Published Japanese Translation of PCT International Publication for Patent Application 2001-513276 (Counterpart U.S. Pat. No. 5,952,849)

However, because it is necessary, for the method that employs photocouplers as the means for insulating the transmitted signals, to consider (1) the temperature characteristics of the current amplification factor hfe of a transistor, (2) the deterioration by aging of the light emission efficiency of a light emitting diode, and (3) the variations of the CTR, it is difficult to design a circuit that can be used continuously over 10 years in vehicles, industrial equipments and such high temperature environments.

The use of a cored transformer as an insulating transformer for signal transmission is affected adversely by the temperature dependence of the magnetic permeability of a magnetic core material, the high temperature dependence of the coupling coefficient, and the difficulties in reducing the costs and dimensions of the apparatus. Since it is impossible to directly send the PWM signal via the cored transformer, it is necessary to modulate the PWM signal at a high frequency and to demodulate the modulated signal received by the secondary winding. Therefore, the circuit scale is inevitably large.

Since the use of an air-cored transformer as an insulating transformer for signal transmission does not employ any magnetic core, the use of the air-cored transformer facilitates reducing the costs and dimensions of the apparatus. However, since the magnetic circuit is not closed, external magnetic fluxes are liable to be superimposed as noise onto the secondary winding, causing malfunctions.

In view of the foregoing, it would be desirable to provide power electronics equipment that facilitates suppressing the deterioration by aging, improving the resistance against hazardous environments, reducing the adverse effects of noises caused by external magnetic fluxes, and transmitting and receiving signals between the high and low voltage sides, while insulating the high and low voltage sides electrically from each other.

Further objects and advantages of the invention will be apparent from the following description of the invention.

SUMMARY OF THE INVENTION

According to the subject matter of a first aspect, there is provided a power electronics equipment including: a pair of switching devices connected in series to each other such that one of the switching devices works for an upper arm and the other one of the switching devices works for a lower arm to make a current flow to a load or to interrupt the current flowing to the load; a control circuit generating control signals directing the conduction and non-conduction of the switching devices; driver circuits driving the control terminals of the respective switching devices based on the control signals; and insulating transformers disposed corresponding to the switching devices such that the control circuit and the driver circuits are insulated from each other, each of the insulating transformers including a primary winding and a secondary winding facing to each other.

The structure of the power electronics equipment described above facilitates forming the primary and secondary windings by etching an electrical conductor, shortening the winding diameters of the primary and secondary windings, and narrowing the spacing between the primary and secondary windings. Therefore, the coupling coefficient of the primary and secondary windings is improved, the area, in which the magnetic flux intersects the primary and secondary windings, is narrowed, and the adverse effects of the noises caused by the external magnetic flux are reduced.

Since signal transmission and reception are conducted between the low and high voltage sides while the low and high voltage sides are insulated electrically from each other, it is unnecessary to employ any photocoupler. Furthermore, the deterioration by aging is suppressed, and the resistance of the power electronics equipment against hazardous environments is improved.

According to the subject matter of a second aspect, the primary and secondary windings are laminated one on the other with an insulator layer interposed between the primary and secondary windings.

Since it is possible to form the primary and secondary windings through a semiconductor process, the adverse effects of the noises caused by the external magnetic flux are reduced while the coupling coefficient of the primary and secondary windings is improved.

According to a third aspect, the insulating transformers are formed by the micro-machining techniques.

The employment of micro-machining techniques facilitates shortening the winding diameters of the primary and secondary windings and narrowing the spacing between the primary and secondary windings. Therefore, the adverse effects of the noises caused by the external magnetic flux intersecting the primary and secondary windings are reduced and the S/N ratio is improved, while the coupling coefficient of the primary and secondary windings is also improved.

According to a forth aspect, the insulating transformers are air-cored. The employment of the air-cored insulating transformers facilitates reducing the temperature dependence caused by the magnetic core and prevents a cost increase caused by the magnetic core.

According to a fifth aspect, each of the switching devices includes an IGBT. Since the employment of the IGBT facilitates realizing high-speed switching operations and securing a sufficient current capacity, the power electronics equipment described in a fifth aspect is applicable to the driving system for driving a motor used, for example, in on-vehicle equipments.

According to a sixth aspect, the control circuit is comprised of a logic circuit, a central processing circuit, or a combination of a logic circuit and a central processing circuit. Since it is possible to integrate the control circuit, various functions are mounted on the control circuit, while the mounting area is prevented from widening.

According to a seventh aspect, the power electronics equipment includes a plurality of insulating transformers transmitting signals between the control circuit and each of the switching devices.

The above described structure makes it possible to transmit and receive signals simultaneously, while electrically insulating the low and high voltage sides from each other. Since it is possible to know the operating states of the switching devices on the control circuit side while controlling the switching devices, the switching devices are operated at a high-speed while the switching devices are prevented from being broken down.

According to an eighth aspect, the signals transmitted between the control circuit and the switching devices include control signals for controlling the respective switching devices and state signals indicating the states of the respective switching devices.

Since it is possible to know the operating states of the switching devices on the control circuit side while controlling the switching devices, the switching devices are operated at a high-speed while the switching devices are prevented from being broken down.

According to a ninth aspect, the power electronics equipment further includes self diagnosis circuits disposed on the side of the switching devices. The self diagnosis circuits generate the state signals of the respective switching devices, and the control circuit stops the control signals or changes the frequency of the control signals in response to the state signals of the respective switching devices.

Since it is possible to know the operating states of the switching devices on the control circuit side while controlling the switching devices, the switching devices are operated at a high speed while the switching devices are prevented from being broken down.

According to a tenth aspect, the power electronics equipment includes: a module including a circuit board, on which the insulating transformers are mounted, and the switching devices arranged thereon.

Since the insulating transformers and the switching devices are integrated into a unit, easy handling of the power electronics equipment is facilitated and the dimensions of the power electronics equipment are reduced.

According to an eleventh aspect, the insulating transformers are mounted on a package.

Even when a plurality of insulating transformers is disposed between the low and high voltage sides, the mounting area is prevented from widening, the dimensions of the power electronics equipment are prevented from increasing, and signals are transmitted and received simultaneously while the low and high voltage sides are electrically insulated from each other.

According to a twelfth aspect, the insulating transformers transmitting the signals for the upper arm and the insulating transformers transmitting the signals for the lower arm are mounted on a package.

The structure described above facilitates operating the switching devices for the upper and lower arms, while preventing the mounting area from widening. The structure further reduces the energy consumption of the driving system for driving a motor used, for example, in on-vehicle equipments, and realizes a high energy conversion efficiency.

According to a thirteenth aspect, the power electronics equipment further includes: a primary side circuit making a pulse current flow through the primary winding of any of the insulating transformers, the pulse current corresponding to the rising and falling edges of the transmitted signal transmitted via the relevant insulating transformer, and a secondary side circuit restoring the transmitted signal based on the level of the voltage pulse generated across the secondary winding of the relevant insulating transformer.

The structure described above facilitates shortening the period, for which currents are made to flow through the primary and secondary windings and making high currents flow through the primary and secondary windings. Since the average values of the currents flowing through the primary and secondary windings are suppressed below the allowable DC current value even when the cross sectional areas of the conductors for the primary and secondary windings are narrowed by micro-machining techniques, melt down of the primary and secondary windings caused by the Joule heat is prevented from occurring and the winding diameters of the primary and secondary windings are shortened.

According to a fourteenth aspect, the power electronics equipment further includes: a primary side circuit making a pulse current flow through the primary winding of any of the insulating transformers, the level of the pulse current being different corresponding to the rising and falling edges of the transmitted signal transmitted via the relevant insulating transformer, and a secondary side circuit restoring the transmitted signal based on the level of the voltage pulse generated across the secondary winding of the relevant insulating transformer.

The structure described above facilitates shortening the period, for which currents are made to flow through the primary and secondary windings and making high currents flow through the primary and secondary windings. Even when the cross sectional areas of the conductors for the primary and secondary windings are narrowed by micro-machining techniques, the average values of currents flowing through the primary and secondary windings are suppressed below the allowable DC current value.

According to a fifteenth aspect, the power electronics equipment further includes: a primary side circuit making a pulse current flow through the primary winding of any of the insulating transformers, the number of the pulses in the pulse current being different corresponding to the rising and falling edges of the transmitted signal transmitted via the relevant insulating transformer, and a secondary side circuit restoring the transmitted signal based on the voltage pulse train generated across the secondary winding of the relevant insulating transformer.

The structure described above facilitates shortening the period, for which currents are made to flow through the primary and secondary windings and making high currents flow through the primary and secondary windings. Even when the cross sectional areas of the conductors for the primary and secondary windings are narrowed by micro-machining techniques, the average values of the currents flowing through the primary and secondary windings are suppressed below the allowable DC current value.

As described above, the power electronics equipment includes insulating transformers formed by micro-machining techniques and facilitates increasing the coupling coefficient of the primary and secondary windings, narrowing the area, in which the magnetic flux intersects the primary and secondary windings, reducing the adverse effects of the noises caused by external magnetic fluxes, suppressing the deterioration by aging, and improving the resistance thereof against hazardous environments.

BRIEF DESCRIPTION OF THE DRAWINGS

FIGS. 4(a) through 4(l) are cross sectional views describing the manufacturing steps for manufacturing an insulating transformer according to a second embodiment of the invention.

DETAILED DESCRIPTION OF PREFERRED EMBODIMENTS

The invention will be described in detail hereinafter with reference to the accompanied drawings that illustrate the specific embodiments of the invention.

Figure 1:
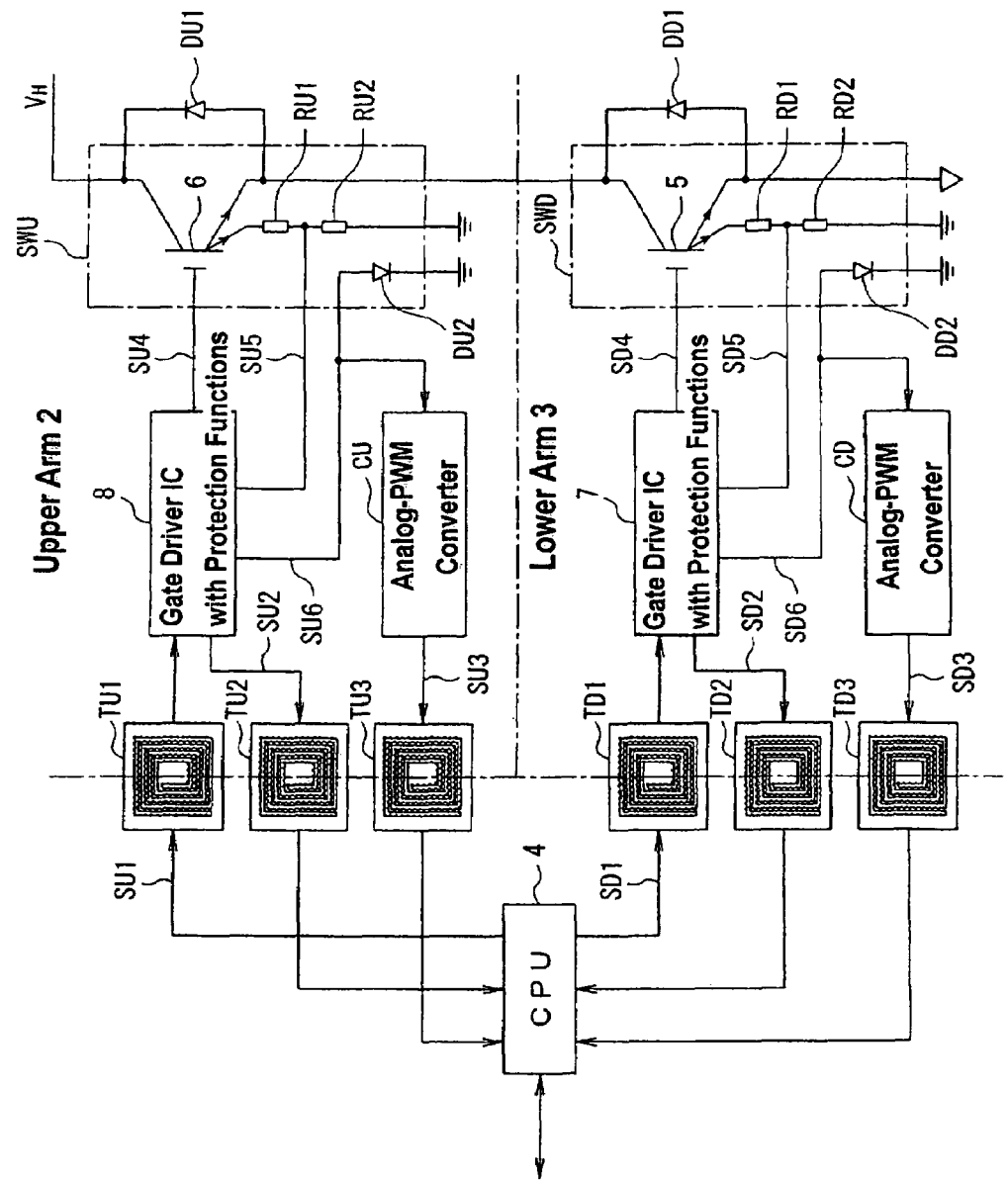
FIG. 1 is a block diagram schematically showing an intelligent power module for a step-up and step-down converter, to which a power electronics equipment according to a first embodiment of the invention is applied.

FIG. 1 is a block diagram schematically showing an intelligent power module for a step-up and step-down converter, to which power electronics equipment according to the first embodiment of the invention is applied.

Referring now to FIG. 1, the intelligent power module for the step-up and step-down converter according to the first embodiment includes a switching device SWU for an upper arm and a switching device SWD for a lower arm that directs a current flow to the load and interrupts the current flowing to the load, and a control circuit 1 that generates control signals directing the conduction and non-conduction of switching devices SWU and SWD. Control circuit 1 may be comprised of a CPU 4 or a logic IC, or a system LSI that mounts a logic IC and a CPU thereon.

Switching devices SWU and SWD are connected in series so that switching devices SWU and SWD may work for upper arm 2 and for lower arm 3, respectively. An IGBT 6 that conducts switching operations in response to a gate signal SU4 is disposed in switching device SWU. A free-wheel diode DU1 that makes a current flow to the direction opposite to the flow direction of the current flowing through IGBT 6 is connected in parallel to IGBT 6. On the chip, in which IGBT 6 is formed, a temperature sensor uses the VF change of a diode DU2 caused by the chip temperature change to perform the measurement thereof. In addition, a current sensor, which detects the main circuit current by dividing the emitter current of IGBT 6 with resistors RU1 and RU2, is also disposed.

An IGBT 5 that conducts switching operations in response to a gate signal SD4 is disposed in switching device SWD. A free-wheel diode DD1 that makes a current flow to the direction opposite to the flow direction of the current flowing through IGBT 5 is connected in parallel to IGBT 5. Also disposed on the chip in which IGBT 5 is formed, is a temperature sensor, which employs the VF change of a diode DD2 caused by the chip temperature change for the measurement principle thereof, and a current sensor, which detects the main circuit current by dividing the emitter current of IGBT 5 with resistors RD1 and RD2.

On the side of upper arm 2, a gate driver IC 8 provides protection functions that monitors an overheat detection signal SU6 from the temperature sensor and an overcurrent detection signal SU5 from the current sensor and generates gate signal SU4 for driving the control terminal of IGBT 6. An analog-PWM converter CU that generates a PWM signal corresponding to the temperature of IGBT 6 is also disposed on the side of upper arm 2. A self-diagnosis circuit that generates the state signals of switching devices SWU and SWD can be disposed in the gate driver IC 8 that provides protection functions. The self-diagnosis circuit is capable of generating the state signals of switching devices SWU and SWD.

On the side of lower arm 3, a gate driver IC 7 is disposed that provides protection functions that monitors an overheat detection signal SD6 from the temperature sensor and an overcurrent detection signal SD5 from the current sensor and generates gate signal SD4 for driving the control terminal of IGBT 5. An analog-PWM converter CD that generates a PWM signal corresponding to the temperature of IGBT 5 is also disposed on the side of lower arm 3.

Air-cored insulating transformers TU1 through TU3 are inserted between control circuit 1 grounded to the vehicle body and upper arm 2 biased at a high voltage. Air-cored insulating transformers TD1 through TD3 are inserted between control circuit 1, grounded to the vehicle body, and lower arm 3 biased at a high voltage. Control circuit 1 transmits signals to upper arm 2 and receives signals from upper arm 2 via air-cored insulating transformers TU1 through TU3, while control circuit 1 is insulated electrically from upper arm 2 by air-cored insulating transformers TU1 through TU3. Control circuit 1 transmits signals to lower arm 3 and receives signals from lower arm 3 via air-cored insulating transformers TD1 through TD3, while control circuit 1 is insulated electrically from lower arm 3 by air-cored insulating transformers TD1 through TD3.

In detail, on the side of upper arm 2, a PWM gate driving signal SU1 outputted from CPU 4 is inputted to gate driver IC 8 which provides protection functions, via air-cored insulating transformer TU1. An alarm signal SU2 outputted from gate driver IC 8, providing protection functions, is inputted to CPU 4 via air-cored insulating transformer TU2. A PWM signal SU3 indicating the IGBT chip temperature and outputted from analog-PWM converter CU is inputted to CPU 4 via air-cored insulating transformer TU3.

On the side of lower arm 3, a PWM gate driving signal SD1 outputted from CPU 4 is inputted to gate driver IC 7 with protection functions via air-cored insulating transformer TD1. An alarm signal SD2 outputted from gate driver IC 7 with protection functions is inputted to CPU 4 via air-cored insulating transformer TD2. A PWM signal SD3 indicating the IGBT chip temperature and outputted from analog-PWM converter CD is inputted to CPU 4 via air-cored insulating transformer TD3.

Air-cored insulating transformers TU1 through TU3 and TD1 through TD3 are provided with primary and secondary windings on the transmitting and receiving sides thereof. The primary and secondary windings in air-cored insulating transformers TU1 through TU3 and TD1 through TD3 are arranged such that the primary and secondary windings are facing to each other. For example, the primary and secondary windings in air-cored insulating transformers TU1 through TU3 and TD1 through TD3 are laminated, one on the other, via an insulator layer. Air-cored insulating transformers TU1 through TU3 and TD1 through TD3 are formed by semiconductor process techniques and other such micro-machining techniques.

CPU 4 generates PWM gate driving signals SD1 and SU1 that direct the conduction and non-conduction of IGBTs 5 and 6 and transmits PWM gate driving signals SD1 and SU1 in an insulated manner to gate driver ICs 7 and 8, with protection functions, via air-cored insulating transformers TD1 and TU1. Gate driver ICs 7 and 8, with protection functions, generate gate signals SD4 and SU4 based on PWM signals SD1 and SU1 for gate driving and drive the control terminals of IGBTs 5 and 6 to make IGBTs 5 and 6 conduct switching operations.

Overheat detection signals SD6 and SU6 outputted from the temperature sensors and overcurrent detection signals SD5 and SU5 outputted from the current sensors are inputted to gate driver ICs 7 and 8 with protection functions. When any of overheat detection signals SD6 and SU6, or any of overcurrent detection signals SD5 and SU5 exceeds the threshold temperature value or the threshold current value, at which IGBTs 5 and 6 are not broken down, gate driver IC 7 or 8 sends alarm signal SD2 or SU2 to CPU 4 via air-cored insulating transformer TD2 or TU2. As CPU 4 receives alarm signal SD2 or SU2, CPU 4 stops generating PWM gate driving signals SD1 and SU1 in order to interrupt the currents flowing through IGBTs 5 and 6.

As a certain period of time passes from the instance at which gate driver ICs 7 and 8, with protection functions, determined that overheat detection signals SD6, SU6 and overcurrent detection signals SD5, SU5 exceeded the respective threshold values, gate driver ICs 7 and 8 with protection functions cancel alarm signals SD2 and SU2.

For monitoring more closely, overheat detection signals SD6 and SU6, outputted from the temperature sensors, are inputted to analog-PWM converters CD and CU. Analog-PWM converters CD and CU convert the analog values of overheat detection signals SD6 and SU6 to the respective digital signals in order to generate IGBT-chip-temperature PWM signals SD3 and SU3 and then transmit IGBT-chip-temperature PWM signals SD3 and SU3 to CPU 4 via air-cored insulating transformers TD3 and TU3. CPU 4 calculates the chip temperatures of IGBTs 5 and 6 from IGBT-chip-temperature PWM signals SD3 and SU3. CPU 4 decreases the switching frequencies of IGBTs 5 and 6 or makes IGBTs 5 and 6 stop switching with reference to several predetermined threshold temperature levels.

If the primary and secondary windings of air-cored insulating transformers TU1 through TU3 and TD1 through TD3 are formed by micro-machining techniques such that the primary and secondary windings are facing to each other, the diameters of the primary and secondary windings and the spacing between the primary and secondary windings may be shortened. Since the area in which the magnetic flux intersects the primary and secondary windings is narrowed, while the coupling coefficient of the primary and secondary windings is increased, the adverse effects of noise caused by the external magnetic fluxes are reduced. Since the signals are transmitted and received between the low and high voltage sides while the low and high voltage sides are insulated electrically from each other, it is not necessary to use a photocoupler and it is possible to suppress deterioration by aging and to improve the resistance against hazardous environments.

Figure 2A:
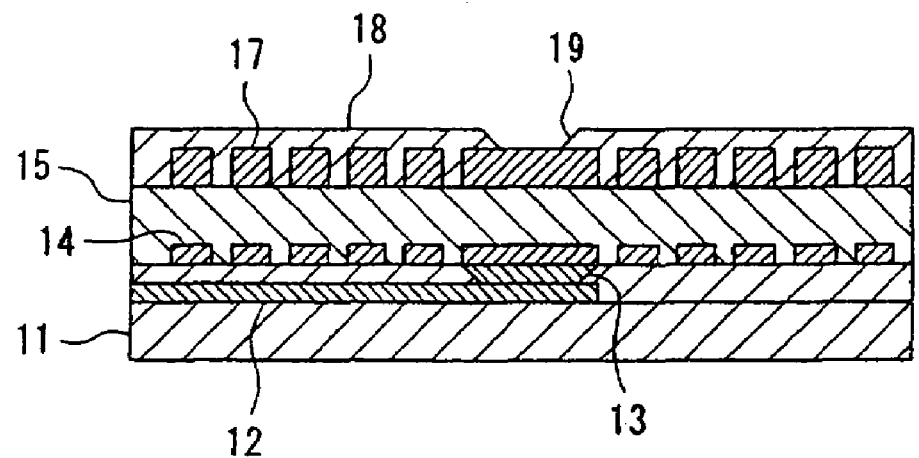
FIG. 2(a) is a cross sectional view schematically showing the insulating transformer according to a first embodiment of the invention.
Figure 2B:
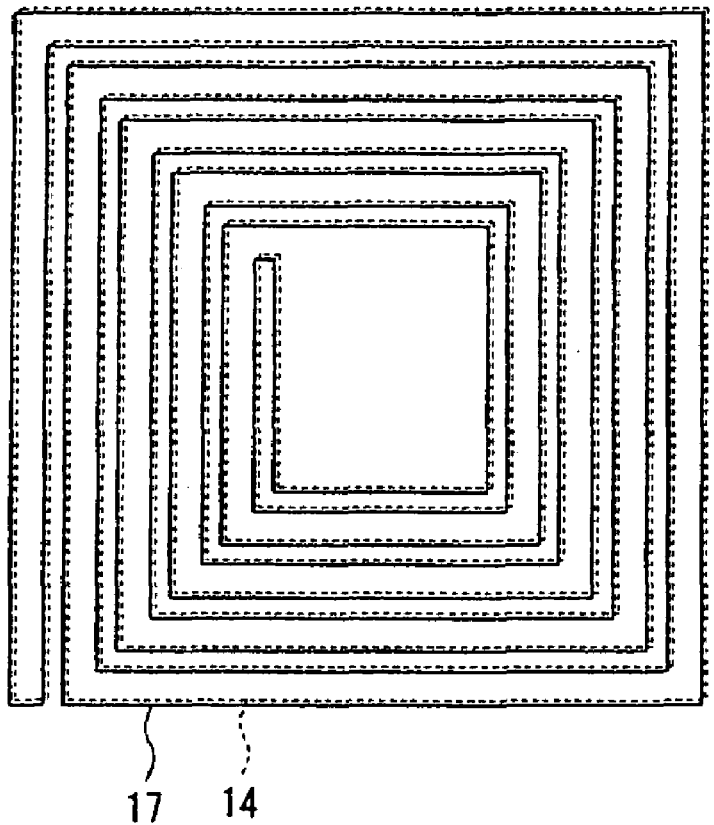
FIG. 2(b) is a top plan view of the insulating transformer shown in FIG. 2(a).

FIG. 2(*a*) is a cross sectional view schematically showing the insulating transformer according to the first embodiment of the invention. FIG. 2(*b*) is a top plan view of the insulating transformer shown in FIG. 2(*a*).

Referring now to these drawings, a lead wiring layer 12 is buried in a substrate 11 and a primary coil pattern 14 is formed on substrate 11. Primary coil pattern 14 is connected to lead wiring layer 12 via a leading port 13. A flattening film 15 is formed on primary coil pattern 14. A secondary coil pattern 17 is formed on flattening film 15. Secondary coil pattern 17 is covered with a protector film 18. An opening 19 is formed in protector film 18 such that the center of secondary coil pattern 17 is exposed through opening 19. Secondary coil pattern 17 is led out by connecting a bonding wire to the center of secondary coil pattern 17 through opening 19.

For example, primary and secondary coil patterns 14 and 17 are 5 to 10 μm in winding width, 4 to 5 μm in thickness, and 500 μm in the maximum winding outer diameter.

Primary and secondary coil patterns 14 and 17 having the dimensions as described above are formed by semiconductor process techniques. Due to this, it is possible to shorten the winding diameters of primary and secondary coil patterns 14 and 17 and to narrow the spacing between primary and secondary coil patterns 14 and 17. Therefore, the area, in which the magnetic flux intersects primary and secondary coil patterns 14 and 17, is narrowed while the coupling coefficient of the primary and secondary coil patterns 14 and 17 is increased. Furthermore, the adverse effects of the noise caused by external magnetic fluxes are reduced.

Figure 3:
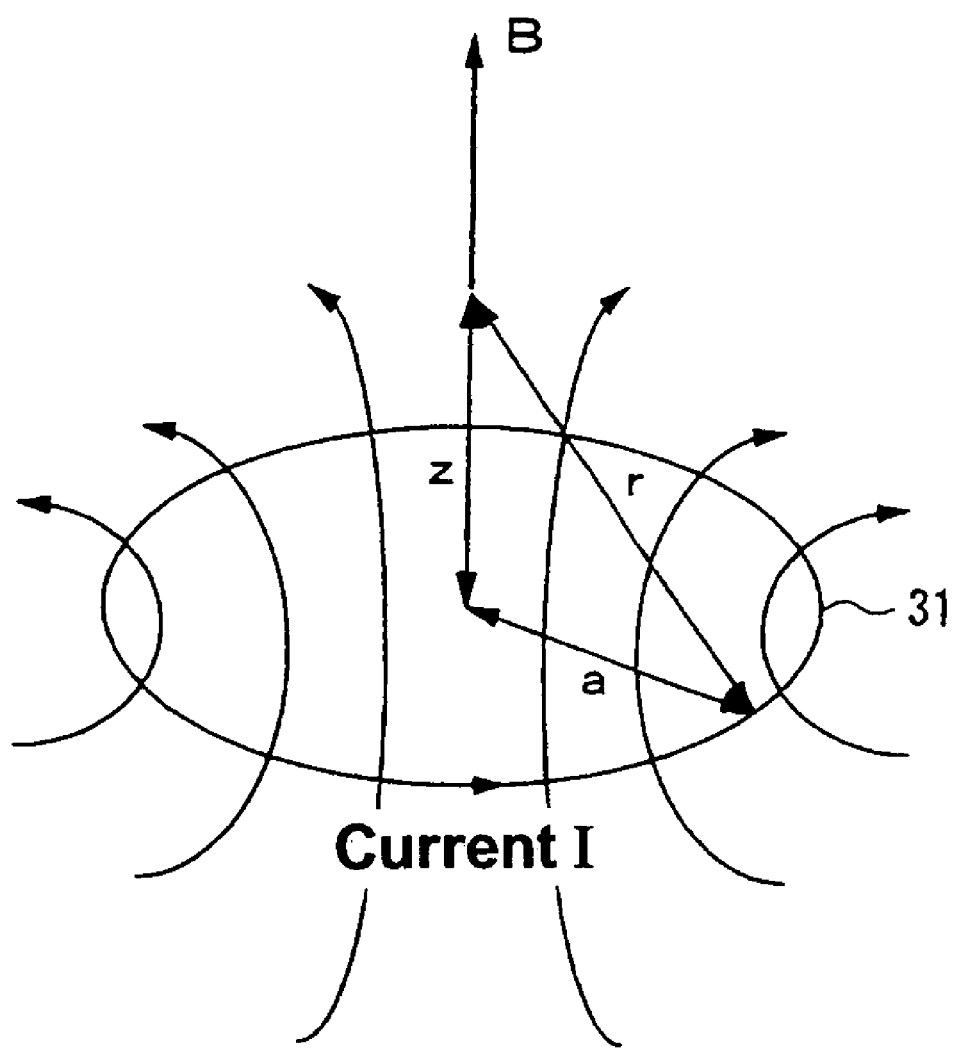
FIG. 3 is a drawing illustrating the magnetic field generated by the current flowing through a rounding coil.
Figure 5A:
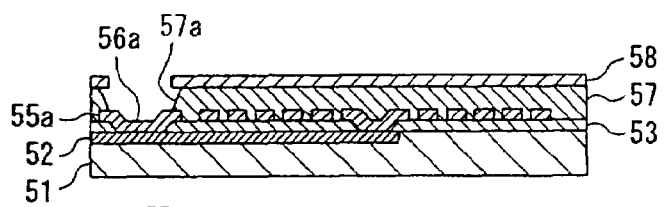
FIGS. 5(a) through 5(h) are other cross sectional views describing the other manufacturing steps for manufacturing the insulating transformer according to the second embodiment of the invention.
Figure 5B:
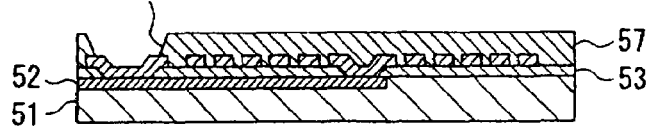
Figure 5C:
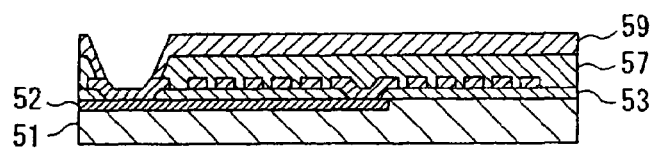
Figure 5D:
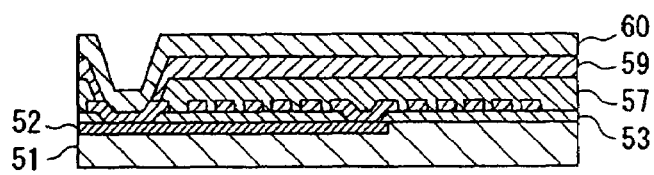
Figure 5E:
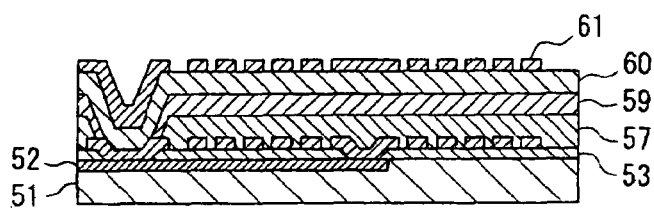
Figure 5F:
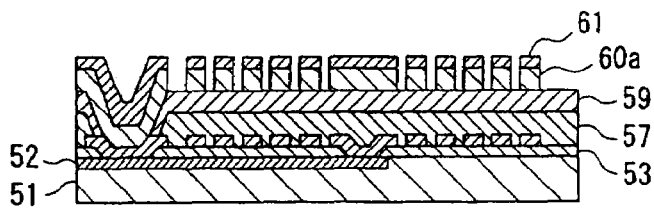
Figure 5G:
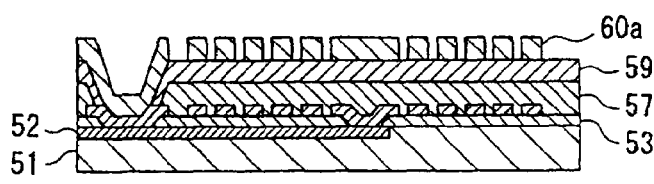
Figure 5H:
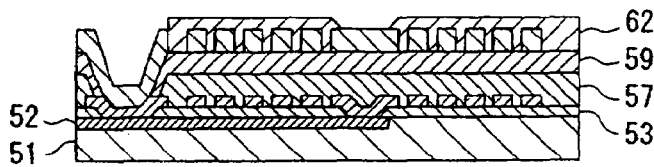

FIG. 3 is a drawing illustrating the magnetic field generated by the current flowing through a rounding coil. When the magnetic flux intersecting a rounding winding 31 changes in FIG. 3, the voltage generated across winding 31 is defined by the following Faraday's law.

$$\oint E \cdot dI = -\int_S (\partial B/\partial t) \cdot ds \quad (1)$$

The voltage $V_T$ generated in the secondary winding by the external magnetic field caused by the main circuit current is expressed by the following formula (3) using the formula (1). The voltage $V_N$ generated in the secondary winding by the signal magnetic field caused by the current (signal current) flowing through the primary winding of an insulating transformer is expressed by the following formula (2).

$$V_N = \oint E_N \cdot dI = -\int_{SR} (\partial B_N/\partial t) \cdot ds \quad (2)$$

$$V_T = \oint E_T \cdot dI = -\int_{SR} (\partial B_T/\partial t) \cdot ds \quad (3)$$

The relationship $V_T \gg V_N$ is made to hold by changing, through the transformer design, the intersection area $S_R$ of the secondary winding and the magnetic flux defined by the secondary winding and the magnetic flux density $B_T$ generated by the signal current. Since the magnetic flux density $B_T$ generated by the signal current is proportional to the signal current value and the number of turns of the winding, the magnetic flux density $B_T$ can be changed by the transformer design.

If one assumes, for the sake of simplicity, that the vector of the magnetic field caused by the main circuit current and the normal vector of the area formed by the rounding of the secondary winding coincide with each other, the intersection area $S_R$ of the secondary winding and the magnetic flux defined by the secondary winding is the area formed by the secondary winding. The magnetic flux density $B_T$ caused in the center of the secondary winding by the rounding current flowing through the primary winding is expressed by the following formulas (4).

$$B_T = (\mu_0/2r) \cdot I_T \, r = (a^2 + z^2)^{1/2} \quad (4)$$

Here, "r" is the distance from the specific position on the primary winding to the observation point, "a" is the radius of the primary winding at the specific position thereof, and "z" is the height from the specific position on the primary winding to the observation point.

If the external magnetic field caused by the main circuit current is uniform and the relationship a>z is maintained, the voltage $V_N$ generated by the external magnetic field caused by the main circuit current will be proportional to $S_R = \pi a^2$ and the voltage $V_T$ generated in the secondary winding by the external magnetic field caused by the main circuit current will be almost proportional to $S_R/a$. As a result, if the winding diameter of winding 31 is made as short as possible, the S/N ratio, that is, $20\log_{10}(V_T/V_N)$, will be larger. Since the winding diameter of the insulating transformer formed by micro-machining techniques is made to be shorter than the winding diameter of the wire-wound transformer using a copper wire, the S/N ratio of an insulating transformer is improved by forming the insulating transformer by the micro-machining techniques.

FIGS. 4(*a*) through 4(*l*) and FIGS. 5(*a*) through 5(*h*) are cross sectional views describing the manufacturing method according to the second embodiment of the invention for manufacturing an insulating transformer.

Referring now to FIG. 4(*a*), a leading diffusion 52 for leading out a primary coil pattern 55*a* from the center thereof is formed in a semiconductor substrate 51 by selectively implanting As, P, B and another such impurity into semiconductor substrate 51. The material for semiconductor substrate 51 is selected from Si, Ge, SiGe, SiC, SiSn, PbS, GaAs, InP, GaP, GaN, and ZnSe.

Referring now to FIG. 4(*b*), an insulator layer 53 is formed by plasma CVD and other such methods on semiconductor substrate 51, in which leading diffusion 52 is formed. For example, a silicon oxide film or a silicon nitride film may be used for insulator layer 53.

Referring now to FIG. 4(*c*), a resist pattern 54, in which an opening 54*a* is formed corresponding to the leading port for leading out primary coil pattern 55*a* from the center thereof, is formed on insulator layer 53 by photolithographic techniques.

Referring now to FIG. 4(*d*), an opening 53*a* corresponding to the leading port for leading out primary coil pattern 55*a* from the center thereof is formed in insulator layer 53 by etching insulator layer 53 using resist pattern 54, in which opening 54*a* is formed, as a mask. Referring now to FIG. 4(*e*), resist pattern 54 is pealed off insulator layer 53 with a reagent.

Referring now to FIG. 4(*f*), an electrically conductive film 55 is formed on insulator layer 53 by sputtering, vacuum deposition, and other such methods. Al, Cu, and such a metal are used for the material of electrically conductive film 55.

Referring now to FIG. 4(*g*), a resist pattern 56 corresponding to primary coil pattern 55*a* is formed using photolithographic techniques.

Referring now to FIG. 4(*h*), primary coil pattern 55*a* is formed on insulator layer 53 by etching electrically conductive film 55 using resist pattern 56 as a mask.

Referring now to FIG. 4(*i*), resist pattern 56 is pealed off primary coil pattern 55*a* with a reagent.

Referring now to FIG. 4(*j*), a flattening film 57 is formed by plasma CVD and other such methods on insulator layer 53, on which primary coil pattern 55*a* is formed. A silicon oxide film or a silicon nitride film may be used for flattening film 57.

Referring now to FIG. 4(*k*), flattening film 57 is flattened by oblique etching, chemical mechanical polishing (hereinafter referred to as "CMP"), and other such methods to remove unevenness from the surface of flattening film 57.

Referring now to FIG. 4(*l*), a resist pattern 58 having an opening 58*a* formed therein corresponding to the leading port for leading out the outer end of primary coil pattern 55*a* is formed on flattening film 57 using photolithographic techniques.

Referring now to FIG. 5(*a*), an opening 57*a* corresponding to the leading port for leading out the outer end of a secondary coil pattern 60*a* is formed in flattening film 57 by etching flattening film 57 using resist pattern 58 having opening 58*a* formed therein as a mask.

Referring now to FIG. 5(*b*), resist pattern 58 is pealed off flattening film 57 with a reagent.

Referring now to FIG. 5(*c*), an isolation layer 59 for isolating primary and secondary coil patterns 55*a* and 60*a* from each other is formed on flattening film 57. For example, isolation layer 59 is formed by coating a polyimide layer on flattening film 57.

Referring now to FIG. 5(*d*), an electrically conductive film 60 is formed on isolation layer 59 by sputtering, vacuum deposition, and other such methods. Al, Cu, and such a metal are used for the material of electrically conductive film 60.

Referring now to FIG. 5(*e*), a resist pattern 61 corresponding to secondary coil pattern 60*a* is formed using photolithographic techniques.

Referring now to FIG. 5(*f*), secondary coil pattern 60*a* is formed on isolation layer 59 by etching electrically conductive film 60 using resist pattern 61 as a mask.

Referring now to FIG. 5(*g*), resist pattern 61 is pealed off secondary coil pattern 60*a* with a reagent.

Referring now to FIG. 5(*h*), a protector film 62 is formed on isolation layer 59, on which secondary coil pattern 60*a* is formed, by plasma CVD and other such methods. A silicon oxide film or a silicon nitride film may be used for protector film 62. Then, the end and central sections of secondary coil pattern 60a are exposed by patterning protector film 62 using photolithographic and etching techniques.

Since it is possible to laminate secondary coil pattern 60a on primary coil pattern 55a by micro-machining techniques, the winding diameters of primary and secondary coil patterns 55a and 60a are shortened and the spacing between primary and secondary coil patterns 55a and 60a is also shortened.

Figure 6:
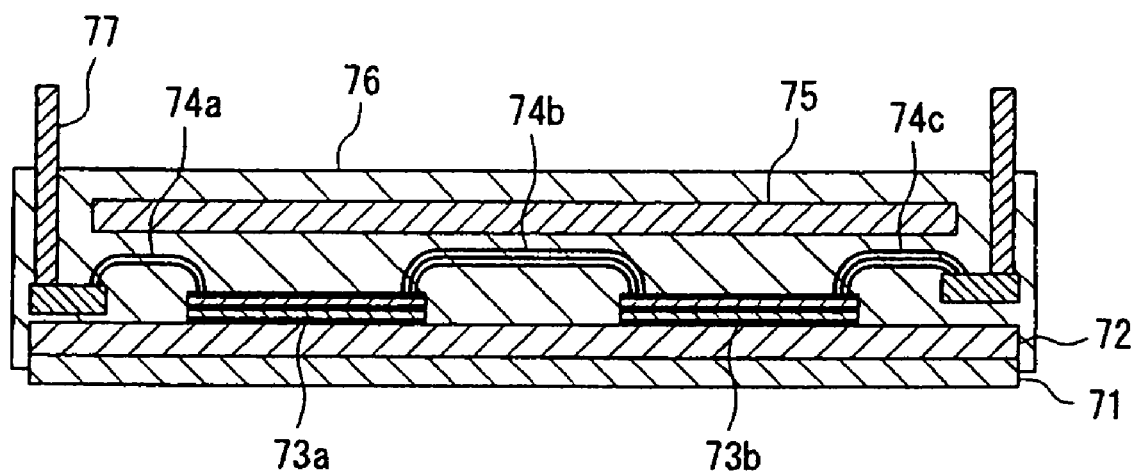
FIG. 6 is a cross sectional view showing the mounted state of an intelligent power module for the step-up and step-down converter according to a third embodiment of the invention.

FIG. 6 is a cross sectional view showing the mounted state of an intelligent power module for the step-up and step-down converter according to the third embodiment of the invention.

Referring now to FIG. 6, an IGBT chip 73a and an FWD chip 73b are mounted on a copper base board 71 for heat dissipation via a ceramics substrate 72 for insulation. IGBT chip 73a and FWD chip 73b are connected to each other, and to a main terminal 77 for taking out the main circuit current, via bonding wires 74a through 74c. A circuit board 75 for driving the IGBT's gate and for monitoring the IGBT is arranged above IGBT chip 73a and FWD chip 73b. IGBT chip 73a, FWD chip 73b, and circuit board 75 are sealed with a mold resin 76. IGBT chip 73a and FWD chip 73b constitute switching devices, which make a current flow to the load and interrupt the current flowing to the load, such that the switching devices for the upper and lower arms are connected in series to each other. A control circuit that generates control signals for directing the conduction and non-conduction of the switching devices is disposed on circuit board 75.

Although the main circuit current flows not only to main terminal 77 but also through bonding wires 74a through 74c connecting main terminal 77 with IGBT chip 73a and FWD chip 73b, the magnetic field generated by the main circuit current flowing through bonding wires 74a through 74c is very influential, since bonding wires 74a through 74c are arranged in close proximity to circuit board 75. In the normal driving, the main circuit current is around 250 A, at most. Sometimes, for example at the time of starting or under the load after slipping, a main circuit current of 900 A, or higher, flows.

Air-cored insulating transformers are inserted between the control circuit, grounded to the vehicle body, and the upper and lower arms, biased at a high voltage. The control circuit transmits and receives signals to and from the upper and lower arms using the air-cored insulating transformers while the control circuit is insulated electrically from the upper and lower arms by the air-cored insulating transformers.

It is possible to shorten the winding diameters of the primary and secondary windings by forming the air-cored insulating transformers using micro-machining techniques. Therefore, it is possible to set the signal level of the output voltage from the secondary winding, that is the receiver side of the air-cored insulating transformer, to be much higher than the noise level caused by a main circuit current flowing through bonding wires 74a through 74c connecting IGBT chip 73a, FWD chip 73b, and main terminal 77, even when the main circuit current is high. Therefore, it is possible to deliver signals without causing any malfunction even when air-cored insulating transformers are used.

The winding conductor cross sectional area of the insulating transformer formed by the micro-machining techniques is smaller than the winding conductor cross sectional area of the winding transformer using a copper wire. The allowable DC current of the insulating transformer formed by micro-machining techniques is much smaller than the allowable DC current of the winding transformer using a copper wire. The allowable DC current is defined by the Joule heat caused by the consumed electric power caused by the current flowing through the resistance of the wiring conductor. Therefore, when the air-cored insulating transformer formed by micro-machining is used, it is possible to set the average current to be smaller than the allowable DC current by shortening the period, for which a current is make to flow through the insulating transformer and by making a high current flow for the shortened period.

Figure 7:
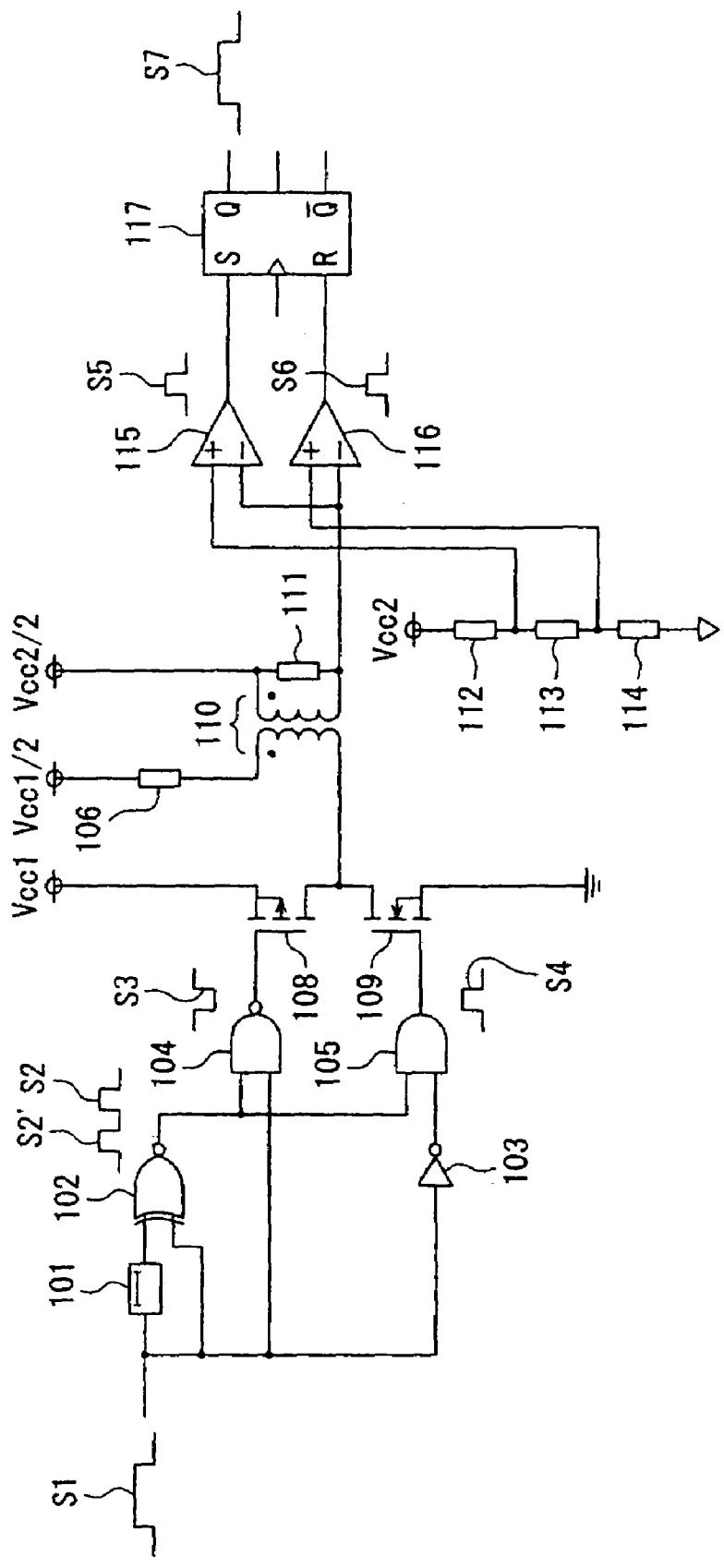
FIG. 7 is a block diagram of a signal transmission circuit that uses an insulating transformer for signal transmission according to a fourth embodiment of the invention.

FIG. 7 is a block diagram of a signal transmission circuit that uses an insulating transformer for signal transmission according to the fourth embodiment of the invention.

Referring now to FIG. 7, a control signal S1 is directly inputted to the first input terminal of an exclusive OR circuit 102 via a delay element 101 and to the second input terminal of exclusive OR circuit 102. The output from exclusive OR circuit 102 is inputted to the first input terminal of a NAND circuit 104 and control signal S1 is inputted to the second input terminal of NAND circuit 104 directly. The output from exclusive OR circuit 102 is inputted to the first input terminals of an AND circuit 105 and control signal S1 is inputted to the second input terminals of AND circuit 105 via an inverter 103.

A p-channel field effect transistor 108 and an n-channel field effect transistor 109 are connected in series to each other. The source of p-channel field effect transistor 108 is connected to a power supply voltage Vcc1 and the source of n-channel field effect transistor 109 is grounded. The output from NAND circuit 104 is connected to the gate of p-channel field effect transistor 108 and the output from AND circuit 105 to the gate of n-channel field effect transistor 109. The first end of the primary winding in an insulating transformer 110 is fixed at half the power supply voltage Vcc1 via a resistor 106, and the second end of the primary winding in insulating transformer 110 is connected to the connection point of p-channel field effect transistor 108 and n-channel field effect transistor 109. The first end of the secondary winding in insulating transformer 110 is fixed at half the power supply voltage Vcc2. The first and second ends of the secondary winding in insulating transformer 110 are connected to each other via a resistor 111. The first end of a resistor 112 is connected to the power supply voltage Vcc2. Resistors 112 through 114 are connected in series so that the potential at the connection point of resistors 112 and 113 may be Vcc2/2+α and the potential at the connection point of resistors 113 and 114 may be Vcc2/2−α.

The non-inverting input terminal of a comparator 115 is fixed at the potential of Vcc2/2+α and the inverting input terminal of comparator 115 is connected to the second end of the secondary winding in insulating transformer 110. The output from comparator 115 is connected to the set terminal of a flip-flop 117. The non-inverting input terminal of a comparator 116 is fixed at the potential of Vcc2/2−α. The inverting input terminal of comparator 116 is connected to the second end of the secondary winding in insulating transformer 110 and the output from comparator 116 to the reset terminal of flip-flop 117.

Control signal S1 that directs the conduction and non-conduction of switching devices SWD and SWU, shown in FIG. 1, and the signal obtained by delaying control signal S1 with delay element 101 are inputted to exclusive OR circuit 102. By calculating the exclusive OR of the inputs in exclusive OR circuit 102, an edge signal S2 synchronized with the rising edge of control signal S1 from "0" to "1" and an edge signal S2' synchronized with the falling edge of control signal S1 from "1" to "0" are extracted. Edge signals S2 and S2' are inputted to NAND circuit 104 and AND circuit 105. A rising edge pulse S3 is generated by calculating the NAND of edge signals S2, S2' and control signal S1 in NAND circuit 104. A falling edge pulse S4 is generated by calculating the AND of edge signals S2, S2' and the inverted signal of control signal S1 in AND circuit 105.

Rising edge pulse S3, generated in NAND circuit 104, is inputted to the gate of p-channel field effect transistor 108. On the rising edge of control signal S1, p-channel field effect transistor 108 makes a pulse current flow into the primary winding of insulating transformer 110 from the power supply. Falling edge pulse S4 generated in AND circuit 105 is inputted to the gate of n-channel field effect transistor 109. On the falling edge of control signal S1, n-channel field effect transistor 109 makes a pulse current flow from the primary winding of insulating transformer 110 to the ground.

Since the flow direction of the current flowing through the primary winding of insulating transformer 110 changes in response to the rising and falling of control signal S1, the direction of the magnetic flux generated on the side of the primary winding changes. Therefore, the direction of the electromotive force generated on the side of the secondary winding that works as a receiver also changes. Thus, it is possible to distinguish the rising and falling of control signal S1.

In detail, the first terminal of the secondary winding in insulating transformer 110 is fixed at half the power supply voltage Vcc2. The voltage at the second terminal of the secondary winding changes to the positive direction from the center value thereof, that is, half the power supply voltage Vcc2, on the rising edge of control signal S1, and to the negative direction from the center value thereof on the falling edge of control signal S1. The output from the secondary winding is fed to comparator 115, the threshold of which is set at Vcc2/2+α and to comparator 116, the threshold of which is set at Vcc2/2−α. Here, α is set preferably to be high enough so as not to cause any malfunction by noises.

On the rising edge of control signal S1, a pulse S5 is outputted from comparator 115 in response to the change of the secondary winding terminal voltage to the positive direction. On the falling edge of control signal S1, a pulse S6 is outputted from comparator 116 in response to the change of the secondary winding terminal voltage to the negative direction. As pulses S5 and S6 are inputted to RS flip-flop 117, RS flip-flop 117 is set by pulse S5 from comparator 115. RS flip-flop 117 is reset by pulse S6 from comparator 116, and a control signal S7 restoring control signal S1 on the transmitter side is generated on the receiver side.

Although the fourth embodiment has been described above in connection with the transmission of the control signal for controlling a switching device, the subject matter of the fourth embodiment is applicable to the transmission of a binary signal indicating the states of the switching device.

Figure 8:
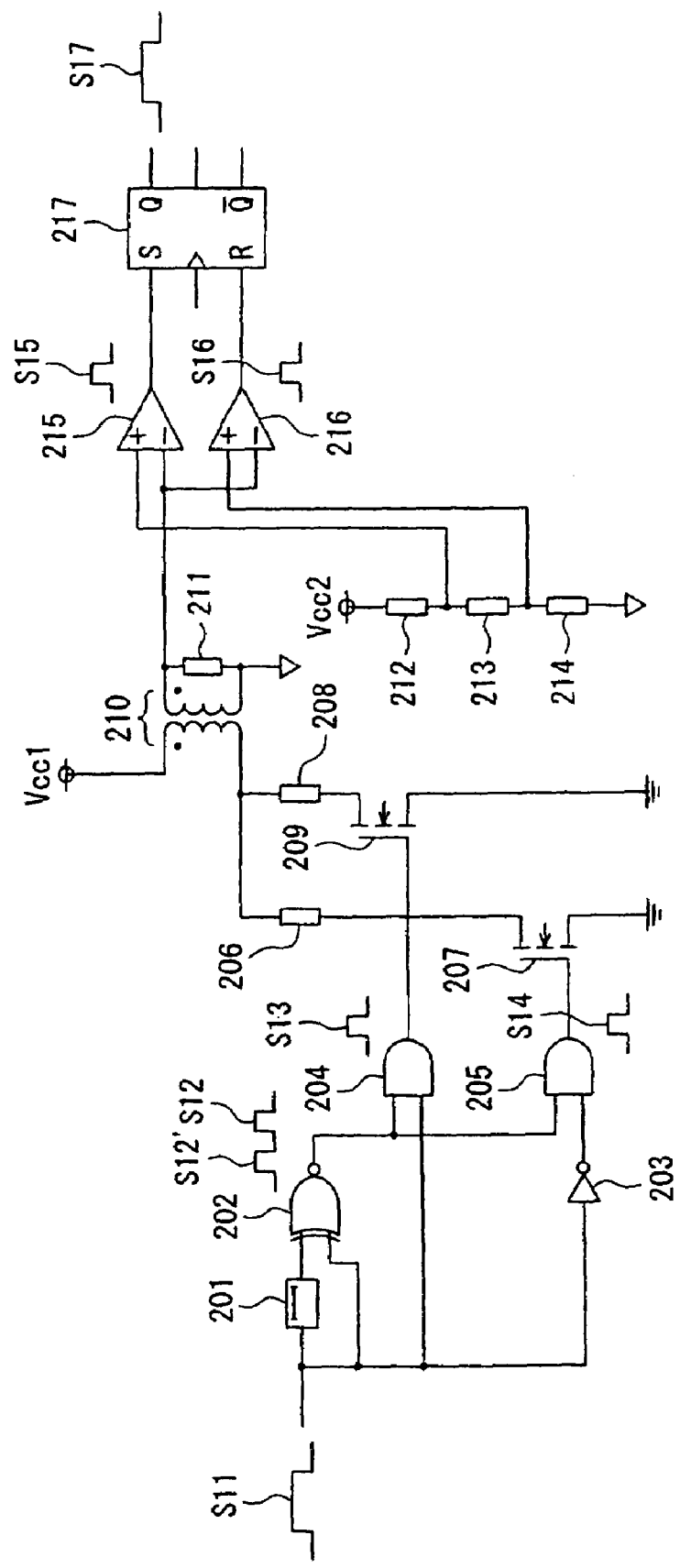
FIG. 8 is a block diagram of a signal transmission circuit that uses an insulating transformer for signal transmission according to a fifth embodiment of the invention.

FIG. 8 is a block diagram of a signal transmission circuit that uses an insulating transformer for signal transmission according to the fifth embodiment of the invention.

Referring now to FIG. 8, a control signal S11 is inputted to the first input terminal of an exclusive OR circuit 202 via a delay element 201 and to the second input terminal of exclusive OR circuit 202 directly. The output from exclusive OR circuit 202 is inputted to the first input terminal of an AND circuit 204 and control signal S11 to the second input terminal of AND circuit 204 directly. The output from exclusive OR circuit 202 is inputted to the first input terminals of an AND circuit 205 and control signal S11 to the second input terminals of AND circuit 205 via an inverter 203.

The drain of an n-channel field effect transistor 207 is connected to the first end of the primary winding in an insulating transformer 210 via a resistor 206 and the drain of an n-channel field effect transistor 209 to the first end of the primary winding in insulating transformer 210 via a resistor 208. If the resistance values of resistors 206 and 208 are selected to be different from each other, the current, flowing through the primary winding of insulating transformer 210 when n-channel field effect transistors 207 and 209 are turned on, may be set to be different on the rising and falling edges of control signal 11. The output from AND circuit 204 is connected to the gate of n-channel field effect transistor 209 and the output from AND circuit 205 is connected to the gate of n-channel field effect transistor 207. The second end of the primary winding in insulating transformer 210 is fixed at the power supply voltage Vcc1. The first and second ends of the secondary winding in insulating transformer 210 are connected to each other via a resistor 211. The first end of a resistor 212 is connected to the power supply voltage Vcc2. Resistors 212 through 214 are connected in series so that the potential at the connection point of resistors 212 and 213 may be Vth2 and the potential at the connection point of resistors 213 and 214 may be Vth1.

The non-inverting input terminal of a comparator 215 is fixed at the potential of Vth1. The inverting input terminal of comparator 215 is connected to the second end of the secondary winding in insulating transformer 210 and the output from comparator 215 is connected to the set terminal of a flip-flop 217. The non-inverting input terminal of a comparator 216 is fixed at the potential of Vth2. The inverting input terminal of comparator 216 is connected to the second end of the secondary winding in insulating transformer 210 and the output from comparator 216 is connected to the reset terminal of flip-flop 217.

Control signal S11, directing the conduction and non-conduction of switching devices SWU and SWD shown in FIG. 1, and the signal obtained by delaying control signal S11 in delay element 201 are inputted to exclusive OR circuit 202. By calculating the exclusive OR of the inputs in exclusive OR circuit 202, an edge signal S12 synchronized with the rising edge of control signal S11 from "0" to "1" and an edge signal S12' synchronized with the falling edge of control signal S11 from "1" to "0" are extracted. Edge signals S12 and S12' are inputted to AND circuits 204 and 205. A rising edge pulse S13 is generated by calculating the AND of edge signals S12, S12' and control signal S11 in AND circuit 204. A falling edge pulse S14 is generated by calculating the AND of edge signals S12, S12' and the inverted signal of control signal S11 in AND circuit 205.

Rising edge pulse S13 generated in AND circuit 204 is inputted to the gate of n-channel field effect transistor 209 and falling edge pulse S14 generated in AND circuit 205 is inputted to the gate of n-channel field effect transistor 207 so that the level of the pulse current flowing through the primary winding of insulating transformer 110 may be different on the rising and falling edges of control signal S11.

Since the level of the current flowing through the primary winding of insulating transformer 110 changes in response to the rising and falling of control signal S11, the strength of the magnetic flux generated on the side of the primary winding changes and the level of the electromotive force generated on the side of the secondary winding that works as a receiver also changes. Thus, it is possible to distinguish the rising and falling of control signal S11 from each other on the receiver side. The electromotive force generated on the secondary winding side is lead to comparator 215, the threshold of which is set at Vth1, and to comparator 216, the threshold of which is set at Vth2.

On the rising edge of control signal S11, a pulse S15 is outputted from comparator 215 in response to the level change caused in the terminal voltage of the secondary winding. On the falling edge of control signal S11, a pulse S16 is outputted from comparator 116 in response to the level change caused in the terminal voltage of the secondary winding. As pulses S15 and S16 are inputted to RS flip-flop 217, RS flip-flop 217 is set by pulse S15 from comparator 215, RS flip-flop 217 is reset by pulse S16 from comparator 216, and a control signal S17 restoring control signal S11 on the transmitter side is generated on the receiver side.

Figure 9:
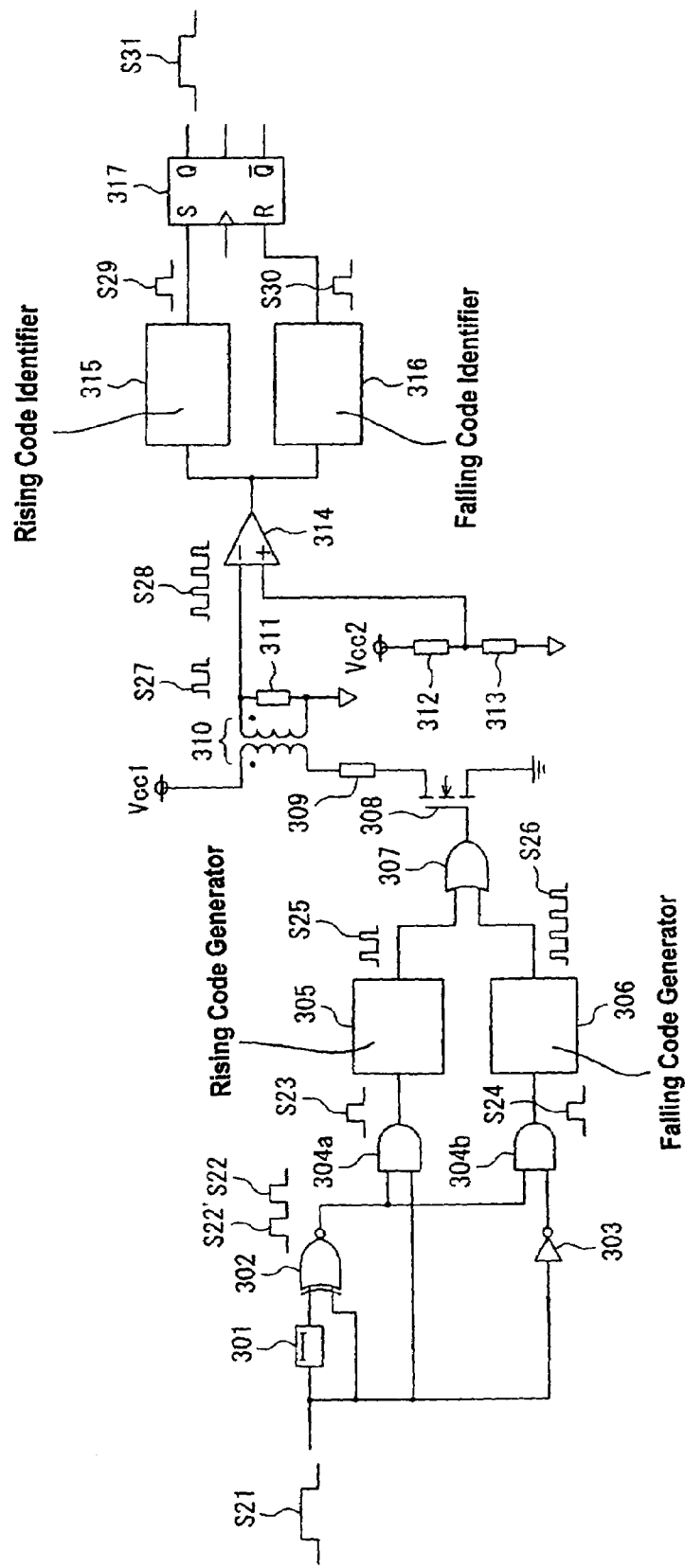
FIG. 9 is a block diagram of a signal transmission circuit that uses an insulating transformer for signal transmission according to a sixth embodiment of the invention.

FIG. 9 is a block diagram of a signal transmission circuit that uses an insulating transformer for signal transmission according to the sixth embodiment of the invention.

Referring now to FIG. 9, a control signal S21 is inputted to the first input terminal of an exclusive OR circuit 302 via a delay element 301 and to the second input terminal of exclusive OR circuit 302 directly. The output from exclusive OR circuit 302 is inputted to the first input terminal of an AND circuit 304a and control signal S21 to the second input terminal of AND circuit 304a directly. The output from exclusive OR circuit 302 is inputted to the first input terminals of an AND circuit 304b and control signal S21 to the second input terminals of AND circuit 304b via an inverter 303.

The output from AND circuit 304a is inputted to a rising code generator 305 and the output from AND circuit 304b to a falling code generator 306. Rising code generator 305 and falling code generator 306 are capable of generating a code for identifying a rising edge pulse S23 outputted from AND circuit 304a and a code for identifying a falling edge pulse S24 outputted from AND circuit 304b, respectively. For example, rising code generator 305 generates one current pulse in response to rising edge pulse S23 outputted from AND circuit 304a and falling code generator 306 generates three current pulses in response to falling edge pulse S24 outputted from AND circuit 304b.

The output from rising code generator 305 is inputted to the first input terminal of an OR circuit 307 and the output from falling code generator 306 to the second input terminal of OR circuit 307.

The output from OR circuit 307 is inputted to the gate of an n-channel field effect transistor 308. The drain of n-channel field effect transistor 308 is connected to the first end of the primary winding in an insulating transformer 310 via a resistor 309.

The second end of the primary winding in insulating transformer 310 is fixed at the power supply voltage Vcc1. The first and second ends of the secondary winding in insulating transformer 310 are connected with each other via a resistor 311. The first end of a resistor 312 is connected to the power supply voltage Vcc2. Resistors 312 and 313 are connected in series so that the potential at the connection point of resistors 312 and 313 may be Vth1.

The non-inverting input terminal of a comparator 314 is fixed at the potential of Vth1. The inverting input terminal of comparator 314 is connected to the second end of the secondary winding in insulating transformer 310. The output from comparator 314 is connected to a rising code identifier 315 and a falling code identifier 316. The output from rising code identifier 315 is connected to the set terminal of a flip-flop 317 and the output from falling code identifier 316 to the reset terminal of flip-flop 317.

Control signal S21, directing the conduction and non-conduction of switching devices SWU and SWD shown in FIG. 1, and the signal obtained by delaying control signal S21 in delay element 301 are inputted to exclusive OR circuit 302. By calculating the exclusive OR of the inputs in exclusive OR circuit 302, an edge signal S22 synchronized with the rising edge of control signal S21 from "0" to "1" and an edge signal S22' synchronized with the falling edge of control signal S21 from "1" to "0" are extracted. Edge signals S22 and S22' are inputted to AND circuits 304a and 304b. Rising edge pulse S23 is generated by calculating the AND of edge signals S22, S22' and control signal S21 in AND circuit 304a. Falling edge pulse S24 is generated by calculating the AND of edge signals S22, S22' and the inverted signal of control signal S11 in AND circuit 304b.

Rising edge pulse S23 generated in AND circuit 304a is inputted to rising code generator 305 and falling edge pulse S24 generated in AND circuit 304b to falling code generator 306. A pulse current S25 for identifying rising edge pulse S23 is generated in rising code generator 305 and a pulse current S26 for identifying falling edge pulse S24 in falling code generator 306, such that the number of pulses in the pulse current flowing through the primary winding is different on the rising and falling edges of control signal S21.

By changing the number of pulses in the pulse current flowing through the primary winding of insulating transformer 310 corresponding to the rising and falling edges of control signal S21, the number of changes caused in the magnetic flux generated on the primary winding side is changed and the number of changes caused in the electromotive force generated on the side of the secondary winding that works as a receiver is also changed. Therefore, it is possible to identify the rising and falling of control signal S21 on the receiver side. The electromotive force generated in the secondary winding is led to comparator 314, the threshold of which is set at Vth1.

On the rising edge of control signal S21, a pulse signal S27 indicating the number of changes caused in the terminal voltage of the secondary winding is outputted. On the falling edge of control signal S21, a pulse signal S28 indicating the number of changes caused in the terminal voltage of the secondary winding is outputted. The outputs from the secondary winding, i.e. pulse signals S27 and S28, are led to rising code identifier 315 and falling code identifier 316 via comparator 314, the threshold of which is set at Vth1.

As pulse signal S27 is inputted to rising code identifier 315 via comparator 314, a pulse signal S29 corresponding to rising edge pulse S23 is restored. As pulse signal S28 is inputted to falling code identifier 316 via comparator 314, a pulse signal S30 corresponding to rising edge pulse S24 is restored. Pulse signals S29 and S30 are inputted to RS flip-flop 317.

As pulse signals S29 and S30 are inputted to RS flip-flop 317, RS flip-flop 317 is set by pulse signal S29 from rising code identifier 315 and is reset by pulse signal S30 from falling code identifier 316. Thus, a control signal S31 restoring control signal S21 on the transmitter side is generated on the receiver side.

Figure 10:
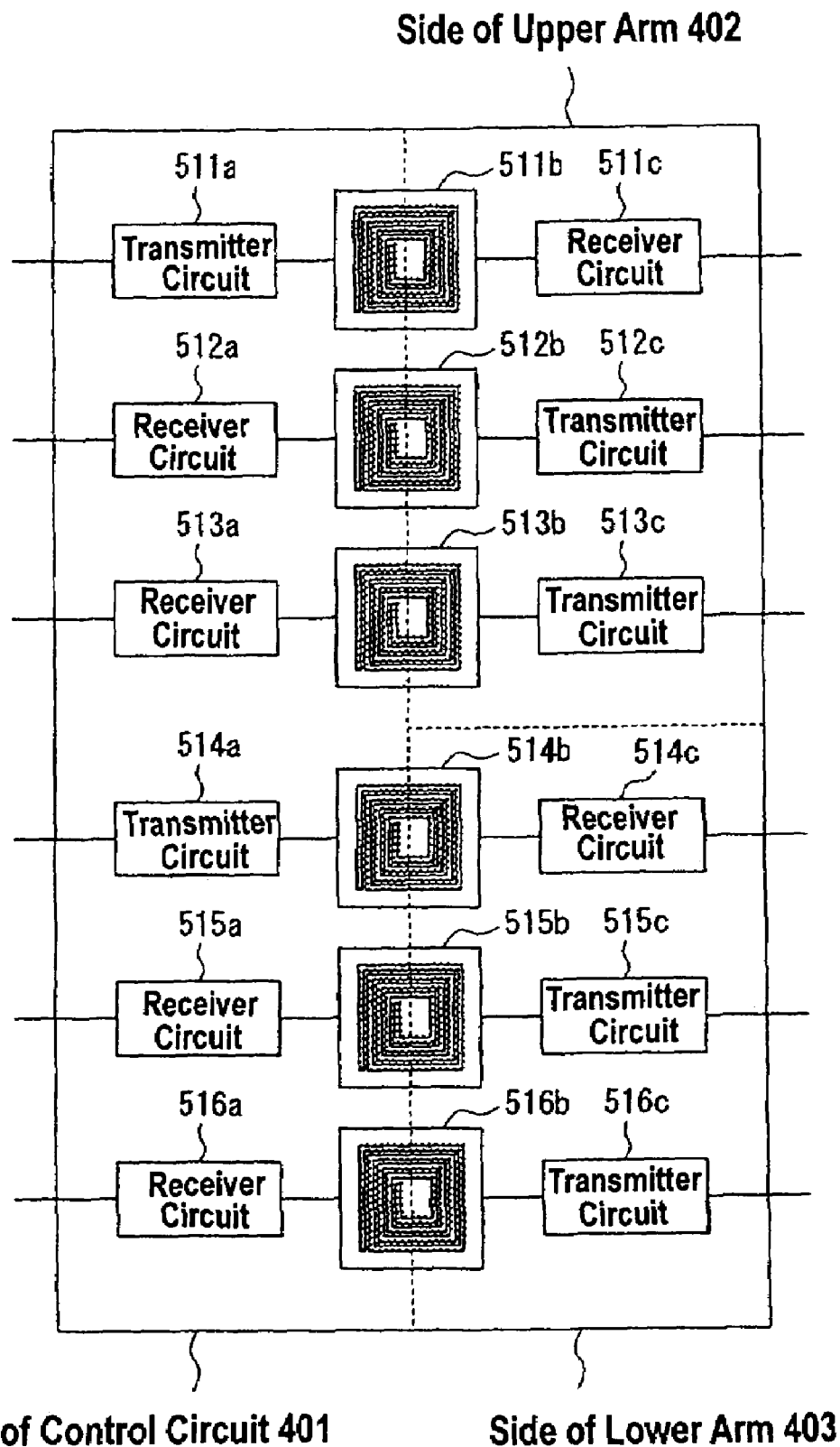
FIG. 10 is a block diagram of a signal transmission circuit that uses insulating transformers for signal transmission according to a seventh embodiment of the invention.
Figure 11:
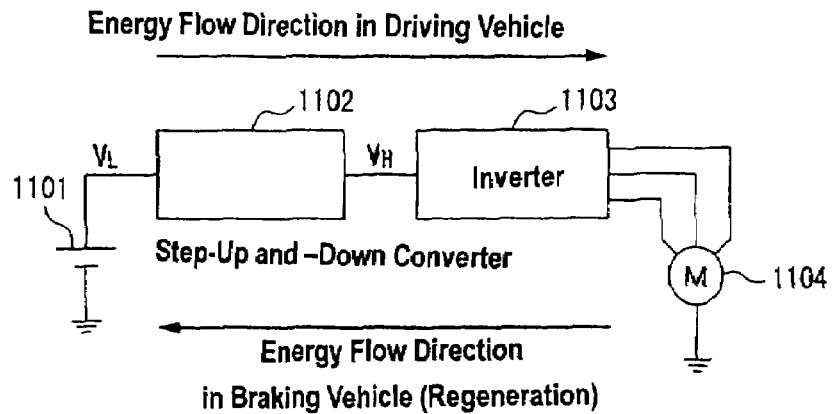
FIG. 11 is a block diagram schematically showing a vehicle driving system that employs a conventional step-up and step-down converter.
Figure 12:
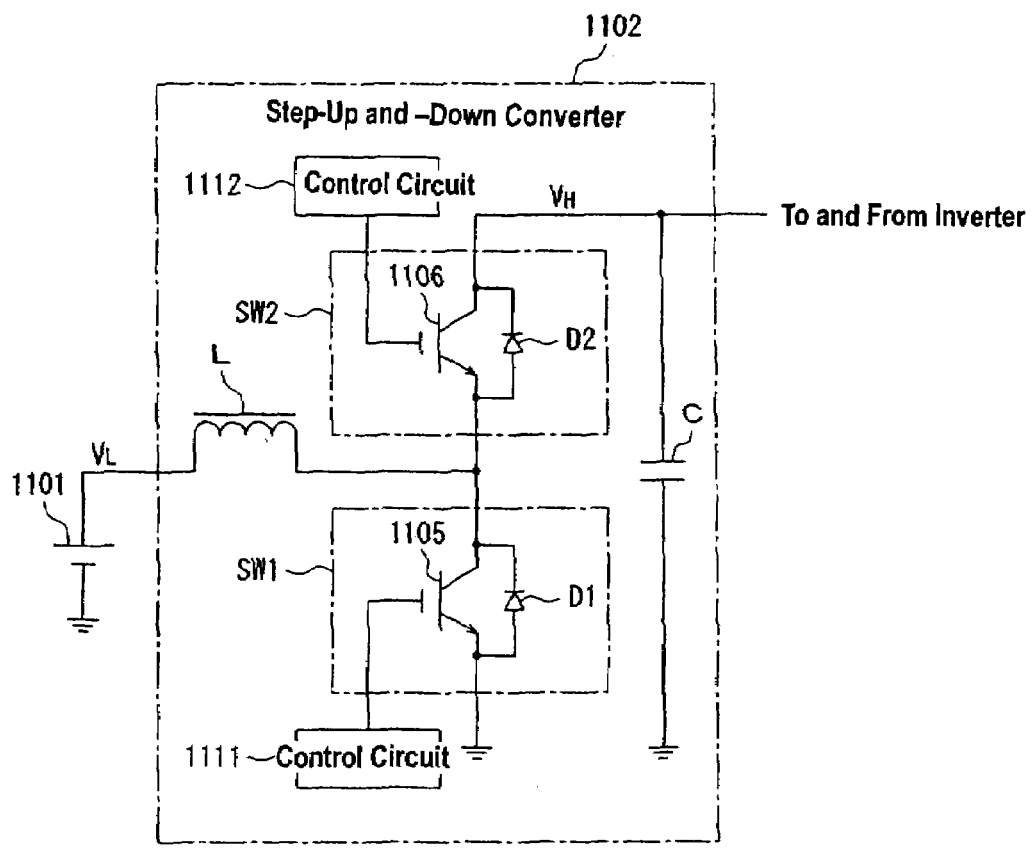
FIG. 12 is a block circuit diagram of the step-up and step-down converter shown in FIG. 11.
Figure 13:
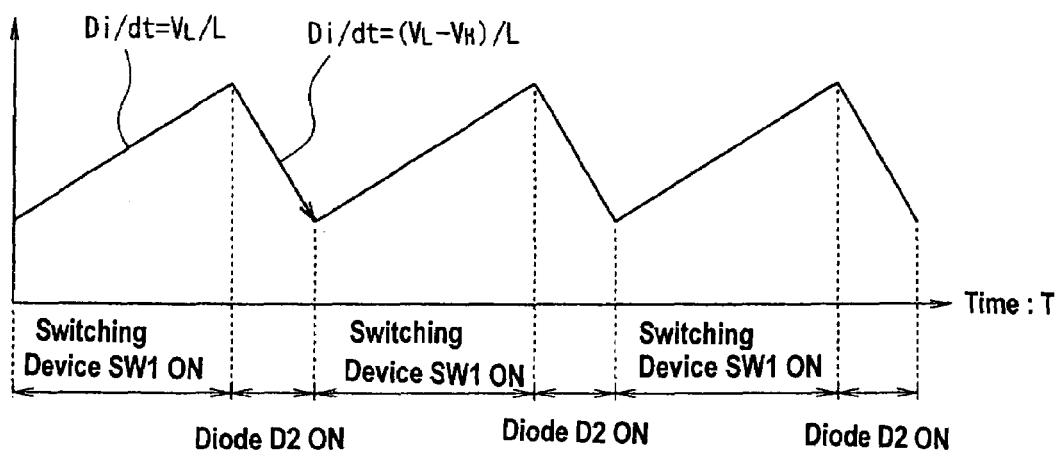
FIG. 13 is a wave chart describing the waveform of the current flowing through the reactor shown in FIG. 12 in the boosting operation.
Figure 14:
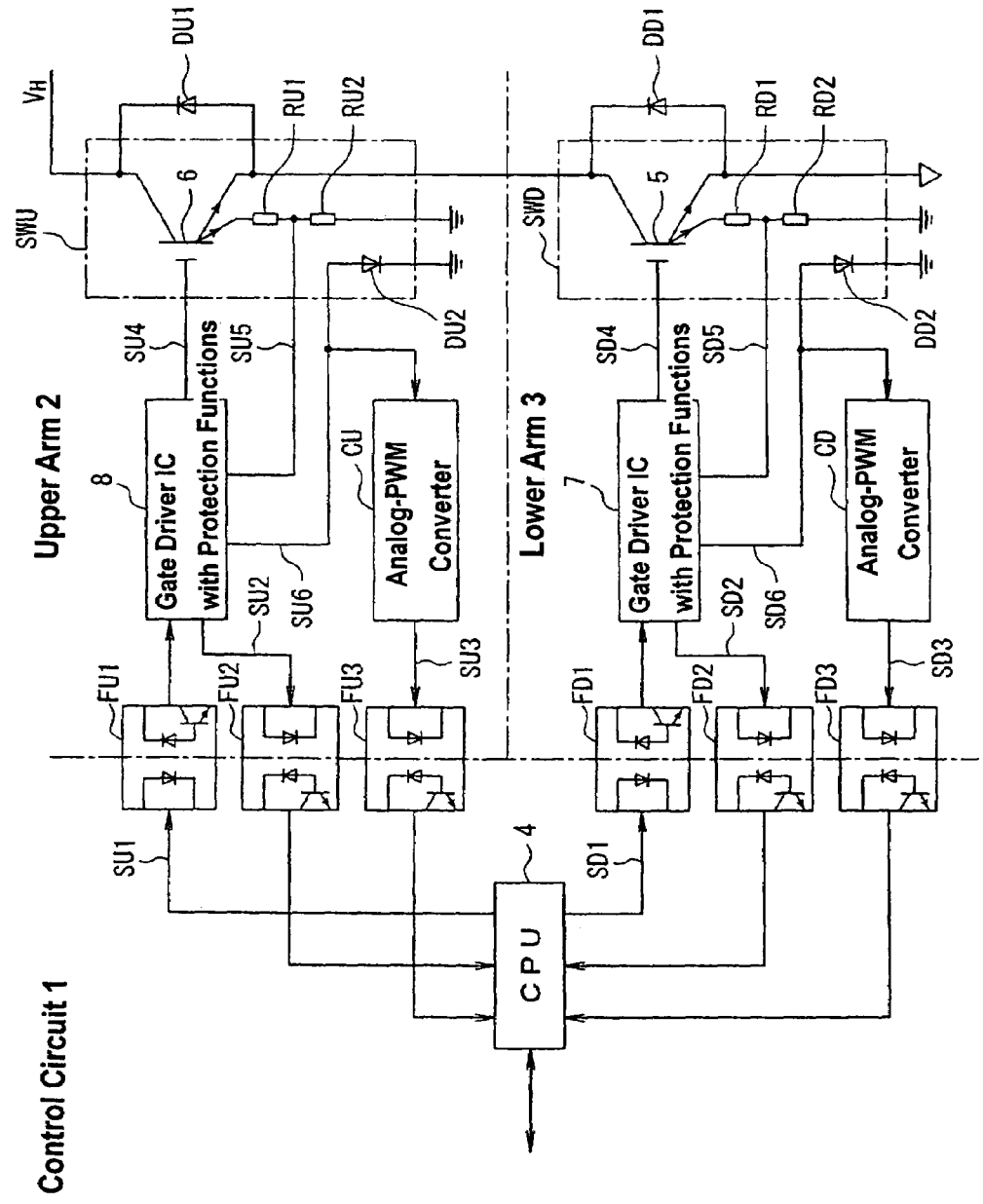
FIG. 14 is a block diagram schematically showing an intelligent power module for the conventional step-up and step-down converter.
Figure 15:
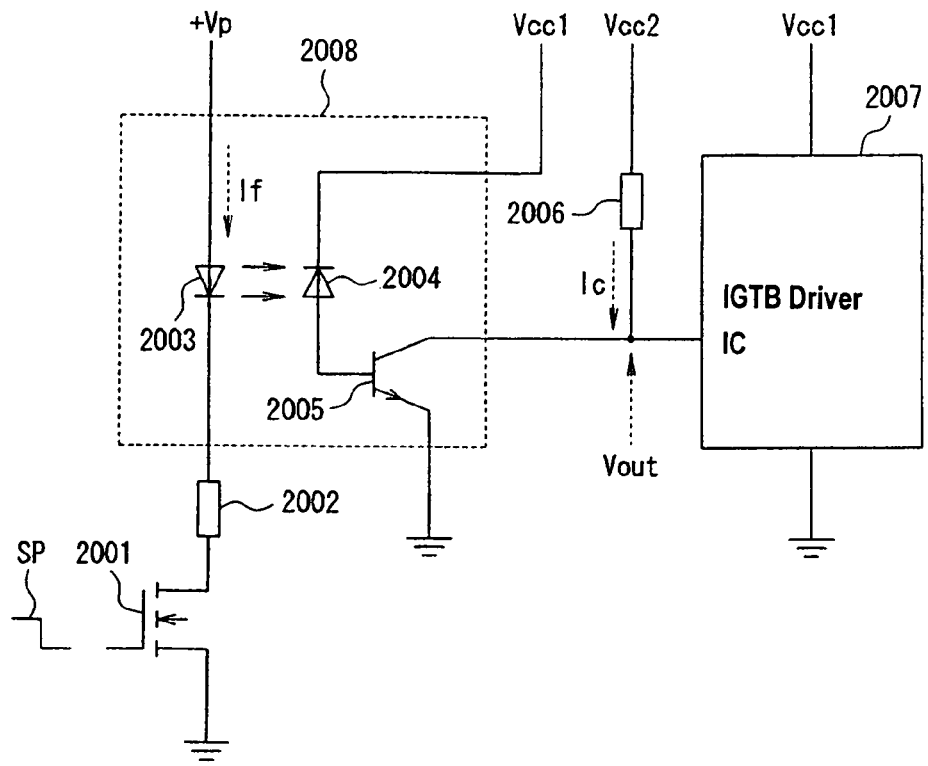
FIG. 15 is a block diagram schematically showing the peripheral circuit of a photocoupler.
Figure 16:
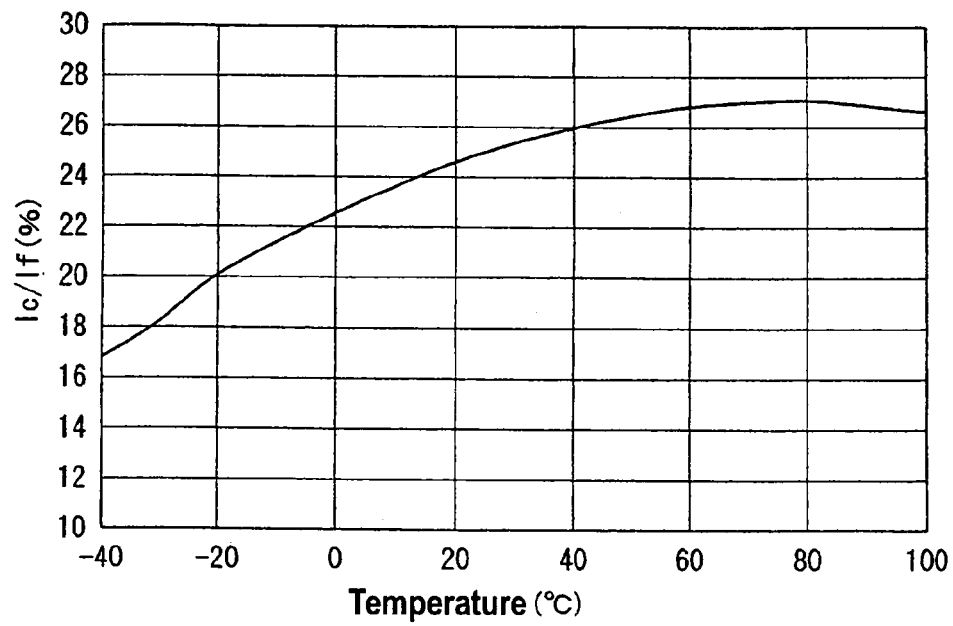
FIG. 16 is a curve describing the temperature dependence of the current transfer ratio of the photocoupler.
Figure 17:
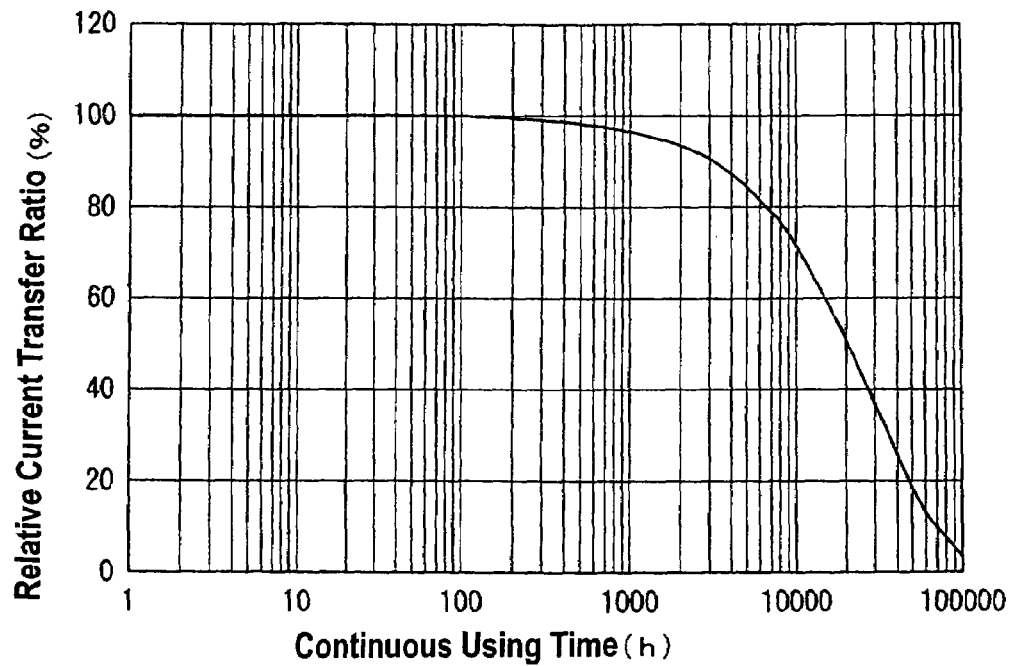
FIG. 17 is a curve describing the deterioration by aging of the current transfer ratio of the photocoupler.
Figure 18:
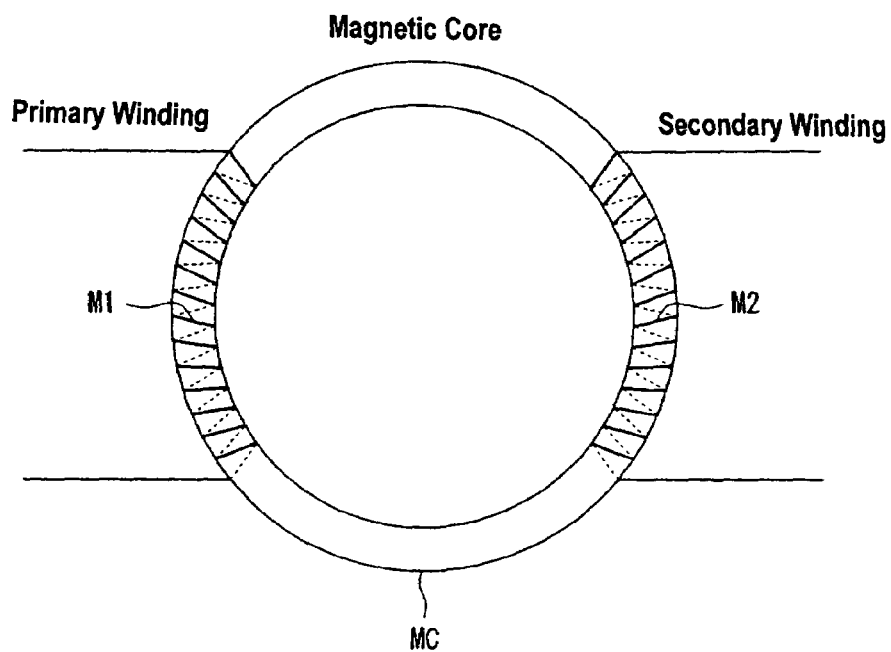
FIG. 18 is a top plan view schematically showing a conventional insulating transformer for signal transmission.
Figure 19:
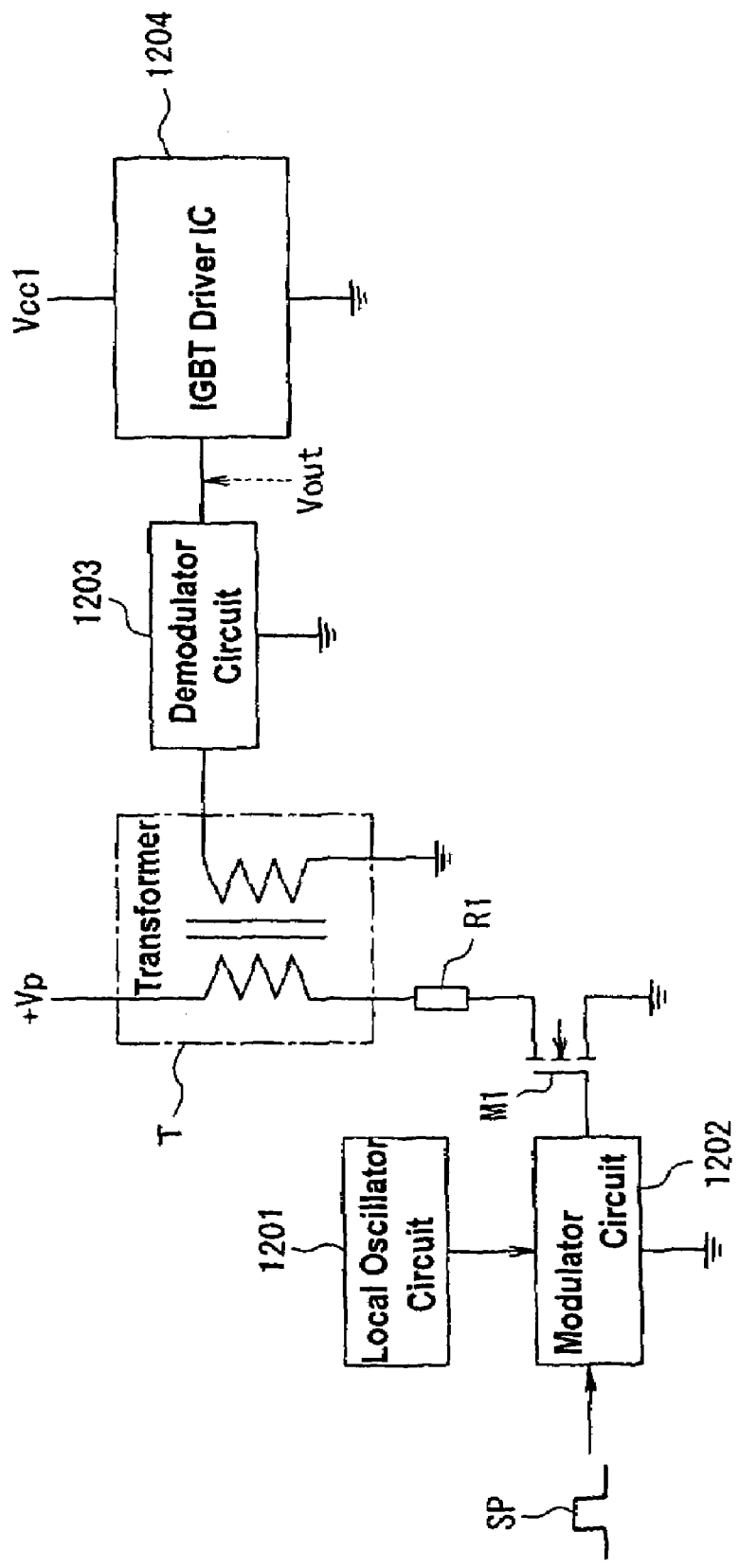
FIG. 19 is a block diagram of a signal transmission circuit using a conventional insulating transformer for signal transmission.

FIG. 10 is a block diagram of a signal transmission circuit that uses insulating transformers for signal transmission according to the seventh embodiment of the invention.

Referring now to FIG. 10, transmitter circuits 511a and 514a and receiver circuits 512a, 513a, 515a, and 516a are disposed on the side of a control circuit 401. On the side of an upper arm 402, a receiver circuit 511c and transmitter circuits 512c and 513c are disposed. On the side of a lower arm 403, a receiver circuit 514c and transmitter circuits 515c and 516c are disposed.

Transmitter circuit 511a and receiver circuit 511c are connected to each other via an insulating transformer 511b. Receiver circuit 512a and transmitter circuit 512c are connected to each other via an insulating transformer 512b. Receiver circuit 513a and transmitter circuit 513c are connected to each other via an insulating transformer 513b.

Transmitter circuit 514a and receiver circuit 514c are connected to each other via an insulating transformer 514b. Receiver circuit 515a and transmitter circuit 515c are connected to each other via an insulating transformer 515b. Receiver circuit 516a and transmitter circuit 516c are connected to each other via an insulating transformer 516b.

Insulating transformers 511b through 516b are formed by micro-machining techniques. The IGBTs and the circuit boards mounted on the sides of upper and lower arms 402 and 403 are assembled into a module. In the circuit boards, since it is possible to reduce the dimensions of insulating transformers 511b through 516b transmitting signals, transmitter circuits 511a, 512c, 513c, 514a, 515c, and 516c, and receiver circuits 511c, 512a, 513a, 514c, 515a, and 516a, multiple sets of the transformer and the circuits may be incorporated into an IC package. Alternatively, the circuits for the upper arm 402 and/or the circuits for the lower arm 403 may be incorporated into an IC package.

The disclosure of Japanese Patent Application No. 2006-073164 filed on Mar. 16, 2006 is incorporated by reference in its entirety.

While the invention has been explained with reference to the specific embodiments of the invention, the explanation is illustrative and the invention is limited only by the appended claims.

What is claimed is:

1. A power electronics equipment comprising:
   a pair of switching devices connected in series to each other and having one switching device working for an upper arm and the other switching device working for a lower arm, said switching devices having control terminals and being operable to make a current flowing to a load or to interrupt the current flowing to the load;
   a control circuit for generating control signals directing conduction and non-conduction of the switching devices;
   driver circuits for driving the control terminals of the respective switching devices based on the control signals; and
   insulating transformers disposed to correspond to the switching devices to insulate the control circuit and the driver circuits from each other, each of the insulating transformers being an air-cored insulating transformer and comprising a substrate, a primary winding, a secondary winding facing the primary winding, and an insulator layer, said primary and second windings being laminated one on the other through the insulator layer and disposed on the same substrate.

2. The power electronics equipment according to claim 1, wherein the insulating transformers are micro-machined insulating transformers.

3. The power electronics equipment according to claim 1, wherein each of the switching devices comprises an insulated gate bipolar transistor.

4. The power electronics equipment according to claim 1, wherein the control circuit comprises at least one of a logic circuit and a central processing circuit.

5. The power electronics equipment according to claim 1, wherein a plurality of said insulating transformers is disposed between the control circuit and each of the switching devices.

6. The power electronics equipment according to claim 1, further comprising a module having a circuit board, on which the insulating transformers are mounted, the switching devices being arranged therein.

7. The power electronics equipment according to claim 1, wherein the insulating transformers are mounted on a package.

8. The power electronics equipment according to claim 1, wherein the insulating transformers transmitting signals for the upper arm and the insulating transformers transmitting signals for the lower arm are mounted on a package.

9. The power electronics equipment according to claim 1, wherein each of the insulating transformer further comprises a lead wiring layer disposed on the substrate and connected to a center of the primary winding, and a protector film disposed on the secondary winding and having an opening at a center thereof extending to the secondary winding.

10. A power electronics equipment comprising:
    a pair of switching devices connected in series to each other and having one switching device working for an upper arm and the other switching device working for a lower arm, said switching devices having control terminals and being operable to make a current flowing to a load or to interrupt the current flowing to the load;
    a control circuit for generating control signals directing conduction and non-conduction of the switching devices;
    driver circuits for driving the control terminals of the respective switching devices based on the control signals; and
    insulating transformers disposed to correspond to the switching devices to insulate the control circuit and the driver circuits from each other, each of the insulating transformers comprising a primary winding and a secondary winding facing each other,
    wherein a plurality of said insulating transformers is disposed between the control circuit and each of the switching devices, and
    wherein the signals transmitted between the control circuit and the switching devices comprise control signals operable to control the respective switching devices and state signals indicating states of the respective switching devices.

11. The power electronics equipment according to claim 10, further comprising at least one self diagnosis circuit disposed on a side of the switching device, the self diagnosis circuit generating the state signals of the respective switching devices, said control circuit being operable to stop the control signals or change frequency of the control signals in response to the state signals of the respective switching devices.

12. A power electronics equipment comprising:
    a pair of switching devices connected in series to each other and having one switching device working for an upper arm and the other switching device working for a lower arm, said switching devices having control terminals and being operable to make a current flowing to a load or to interrupt the current flowing to the load;
    a control circuit for generating control signals directing conduction and non-conduction of the switching devices;
    driver circuits for driving the control terminals of the respective switching devices based on the control signals;
    insulating transformers disposed to correspond to the switching devices to insulate the control circuit and the driver circuits from each other, each of the insulating transformers comprising a primary winding and a secondary winding facing each other,
    a primary side circuit operable to make a pulse current flow through the primary windings of the insulating transformers, the pulse current corresponding to rising and falling edges of transmitted signal transmitted via the relevant insulating transformer, and a secondary side circuit restoring the transmitted signal based on a level of a voltage pulse generated across the secondary winding of the relevant insulating transformer.

13. A power electronics equipment comprising:

a pair of switching devices connected in series to each other and having one switching device working for an upper arm and the other switching device working for a lower arm, said switching devices having control terminals and being operable to make a current flowing to a load or to interrupt the current flowing to the load;

a control circuit for generating control signals directing conduction and non-conduction of the switching devices;

driver circuits for driving the control terminals of the respective switching devices based on the control signals;

insulating transformers disposed to correspond to the switching devices to insulate the control circuit and the driver circuits from each other, each of the insulating transformers comprising a primary winding and a secondary winding facing each other, a primary side circuit making a pulse current flow through the primary winding of the insulating transformer, a level of the pulse current being different corresponding to rising and falling edges of a transmitted signal transmitted via the relevant insulating transformer, and a secondary side circuit restoring the transmitted signal based on a level of the voltage pulse generated across the secondary winding of the relevant insulating transformer.

14. A power electronics equipment comprising:

a pair of switching devices connected in series to each other and having one switching device working for an upper arm and the other switching device working for a lower arm, said switching devices having control terminals and being operable to make a current flowing to a load or to interrupt the current flowing to the load;

a control circuit for generating control signals directing conduction and non-conduction of the switching devices;

driver circuits for driving the control terminals of the respective switching devices based on the control signals;

insulating transformers disposed to correspond to the switching devices to insulate the control circuit and the driver circuits from each other, each of the insulating transformers comprising a primary winding and a secondary winding facing each other, a primary side circuit making a pulse current flow through the primary winding of the insulating transformer, number of the pulses in a pulse current being different corresponding to rising and falling edges of the transmitted signal transmitted via the relevant insulating transformer, and a secondary side circuit restoring the transmitted signal based on a voltage pulse train generated across the secondary winding of the relevant insulating transformer.

* * * * *